(12) United States Patent
Nakagawa

(10) Patent No.: US 10,718,982 B2
(45) Date of Patent: Jul. 21, 2020

(54) LIQUID CRYSTAL DISPLAY DEVICES

(71) Applicant: Panasonic Liquid Crystal Display Co., Ltd., Hyogo (JP)

(72) Inventor: Teruhisa Nakagawa, Hyogo (JP)

(73) Assignee: PANASONIC LIQUID CRYSTAL DISPLAY CO., LTD., Hyogo (JP)

( * ) Notice: Subject to any disclaimer, the term of this patent is extended or adjusted under 35 U.S.C. 154(b) by 85 days.

(21) Appl. No.: 15/939,306

(22) Filed: Mar. 29, 2018

(65) Prior Publication Data

US 2019/0302553 A1 Oct. 3, 2019

(51) Int. Cl.

| G02F 1/1345 | (2006.01) |
|---|---|
| G02F 1/1362 | (2006.01) |
| G02F 1/1368 | (2006.01) |
| H01L 27/12 | (2006.01) |
| G02F 1/1335 | (2006.01) |
| G02F 1/1337 | (2006.01) |

(52) U.S. Cl.
CPC ........ *G02F 1/13452* (2013.01); *G02F 1/1368* (2013.01); *G02F 1/13454* (2013.01); *G02F 1/136286* (2013.01); *G02F 1/1337* (2013.01); *G02F 1/133512* (2013.01); *G02F 1/133514* (2013.01); *G02F 2201/121* (2013.01); *G02F 2201/123* (2013.01); *H01L 27/124* (2013.01)

(58) Field of Classification Search
CPC ... G02F 1/136286; G02F 2001/133391; G02F 1/13452; G02F 1/13454
See application file for complete search history.

(56) References Cited

U.S. PATENT DOCUMENTS

| 7,746,436 B2 * | 6/2010 | Shin ................. G02F 1/134336 349/129 |
|---|---|---|
| 8,054,434 B2 * | 11/2011 | Jun .................. G02F 1/133707 349/141 |
| 2010/0066967 A1 * | 3/2010 | Takahashi ............ G02F 1/1345 349/143 |
| 2014/0375534 A1 * | 12/2014 | Lee ...................... G09G 3/3648 345/87 |
| 2014/0375922 A1 | 12/2014 | Park et al. |

* cited by examiner

*Primary Examiner* — Dung T Nguyen
(74) *Attorney, Agent, or Firm* — HEA Law PLLC

(57) ABSTRACT

Techniques of reducing bezel size of liquid crystal display (LCD) devices are described. Techniques of the present subject matter allow reduction in the bezel size of an LCD device while maintaining the aspect ratio of pixels of an LCD panel. In an example, an LCD panel of the LCD device may include a plurality of sub-pixels arranged in a first direction and a second direction in a matrix arrangement, and a plurality of gate lines extending in the first direction and a plurality of source lines extending in the second direction. Further, The LCD panel may include a plurality of source lead-out lines extending in the first direction, wherein each of the plurality of source lead-out lines is electrically connected to at least one of the plurality of source lines.

13 Claims, 16 Drawing Sheets

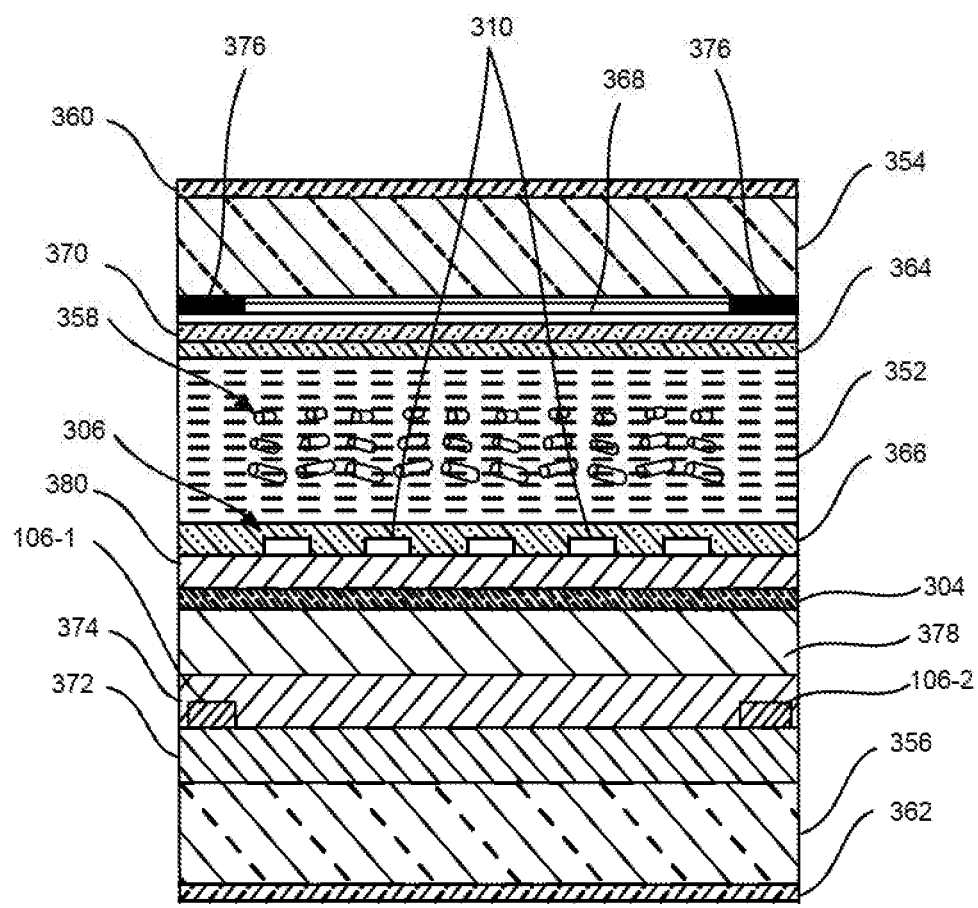
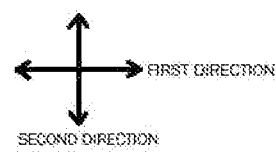
FIG. 3B

LIQUID CRYSTAL DISPLAY DEVICES

TECHNICAL FIELD

The present subject matter relates, in general, to liquid display devices and in particular, to driving of the liquid crystal display (LCD) devices.

BACKGROUND

Liquid crystal display (LCD) devices have become ubiquitous in today's daily life of humans. LCD panels are used in various electronic devices, such as televisions, laptops, tablets, and other communication devices, such as smartphones, notebooks, and personal digital assistants (PDAs). An electronic device generally comprises a bezel that houses an LCD panel securely within the electronic device. The bezel houses various other components apart from the LCD panel, such as driving circuits, image controllers, and image processors for driving the LCD panel.

SUMMARY

Techniques of reducing a bezel size of liquid crystal display (LCD) devices are described. Techniques of the present subject matter allow reduction in the bezel size of an LCD device while maintaining the aspect ratio of pixels of an LCD panel of the LCD device.

In an example, an LCD device may include an LCD panel, where the LCD panel includes a plurality of pixels arranged in a first direction and a second direction in a matrix arrangement. The LCD panel may also include a plurality of gate lines extending in the first direction and a plurality of source lines extending in the second direction. The LCD panel also includes a plurality of source lead-out lines extending in the first direction, where each of the plurality of source lead-out lines is electrically connected to at least one of the plurality of source lines.

According to an example implementation of the present subject matter, each pixel from the plurality of pixels may include a plurality of sub-pixels, and a sub-pixel from the plurality of sub-pixels may include a first region including a first set of slits extending in one direction, a second region including a second set of slits extending in another direction, and a third region including a boundary of the first set of slits and the second set of slits.

In an example of the present subject matter, a source lead-out line from the plurality of source lead-out lines may extend along the third region of the sub-pixel, where each of the plurality of source lead-out lines is electrically connected to the at least one of the plurality of source lines through a contact point, and where the contact point overlaps at least a part of the third region in plan view.

Further, in an example of the present subject matter, at least two source lead-out lines from the plurality of source lead-out lines overlap a part of the third region of the sub-pixel in plan view. The LCD device may further include a gate driver placed at a first side of the LCD panel, the gate driver being electrically connected to the plurality of gate lines. The LCD device may also include a source driver placed at the first side of the LCD panel, the source driver being electrically connected to the plurality of source lines via the plurality of source lead-out lines.

The LCD device may further include a gate driver placed at a first side of the LCD panel, the gate driver being electrically connected to the plurality of gate lines. The LCD device may also include a source driver placed at a second side of the LCD panel opposite to the first side, the source driver being electrically connected to the plurality of source lines via the plurality of source lead-out lines.

In an example of the present subject matter, the LCD panel of the LCD device is divided into two segments, a first segment and a second segment by a line along the second direction, where the plurality of source lead-out lines includes a first set of source lead-out line formed in the first segment, a second set of source lead-out line formed in the second segment, and the first set of source lead-out lines and the second set of source lead-out line are electrically isolated from each other.

Further, the LCD device may include a first source driver placed at a first side of the LCD panel, the first source driver being electrically connected to the first set of source lead-out lines, and a second source driver placed at a second side of the LCD panel opposite to the first side, the second source driver being electrically connected to the second set of source lead-out lines.

The LCD device may further include a first gate driver placed at the first side of the LCD panel, where the first gate driver is electrically connected to the plurality of gate lines, and each of the plurality of gate line extends continuously in both the first segment and the second segment.

Further, the plurality of gate lines may include a first gate line and a second gate line formed adjacent to each other, the first set of source lead-out lines include a first source lead-out line, and the second set of source lead-out lines include a second source lead-out line, where the first source lead-out line and the second source lead-out line are formed between the first gate line and the second gate line. In an example of the present subject matter, the plurality of gate lines and the plurality of source lead-out lines are formed in a same layer.

In an example of the present subject matter, an LCD device including an LCD panel is described. The LCD panel may include a plurality of pixels arranged in a first direction and a second direction in a matrix arrangement. The LCD panel may also include a plurality of gate lines extending in one of the first direction and the second direction, and a plurality of source lines extending in other of the first direction and the second direction. The LCD panel may also include a plurality of lead-out lines extending in the first direction, the plurality of lead-out lines being electrically connected to one of the plurality of gate lines and the plurality of source lines. Also, each pixel from the plurality of pixels of the LCD panel may include a plurality of sub-pixels, where a sub-pixel from the plurality of sub-pixels may include a first region including a first set of slits extending in one direction, a second region including a second set of slits extending in another direction, and a third region including boundary of the first set of slits and the second set of slits. Further, a lead-out line from the plurality of lead-out lines may extend along the third region of the sub-pixel. In an example of the present subject matter, at least two lead-out lines from the plurality of lead-out lines overlap a part of the third region of the sub-pixel.

In an example of the present subject matter, the LCD panel may be divided into two segments a first segment and a second segment by a line along the first direction, where the plurality of lead-out lines includes a first set of lead-out line formed in the first segment; a second set of lead-out line formed in the second segment, and the first set of lead-out lines and the second set of lead-out lines are electrically isolated from each other.

Further, the LCD panel may further include a first gate driver placed at a first side of the LCD panel, the first gate driver being electrically connected to the first set of lead-out line. The LCD device may also include a second gate driver placed at a second side of the LCD panel opposite to the first side, the second source driver being electrically connected to the second set of lead-out line.

The LCD device further includes a first source driver placed at the first side of the LCD panel, where the first source driver is electrically connected to the plurality of source lines, and each of the plurality of source lines extends continuously in both the first segment and the second segment. Further, the plurality of source lines includes a first source line and a second source line formed adjacent to each other, the first set of lead-out lines include a first lead-out line and the second set of lead-out lines include a second lead-out line, where the first lead-out line and the second lead-out line are formed between the first source line and the second source line.

BRIEF DESCRIPTION OF FIGURES

The following detailed description references the drawings, wherein:

FIG. 3B illustrates a cross sectional view of a sub-pixel, according to an example implementation of the present subject matter;

DETAILED DESCRIPTION

Figure 1:
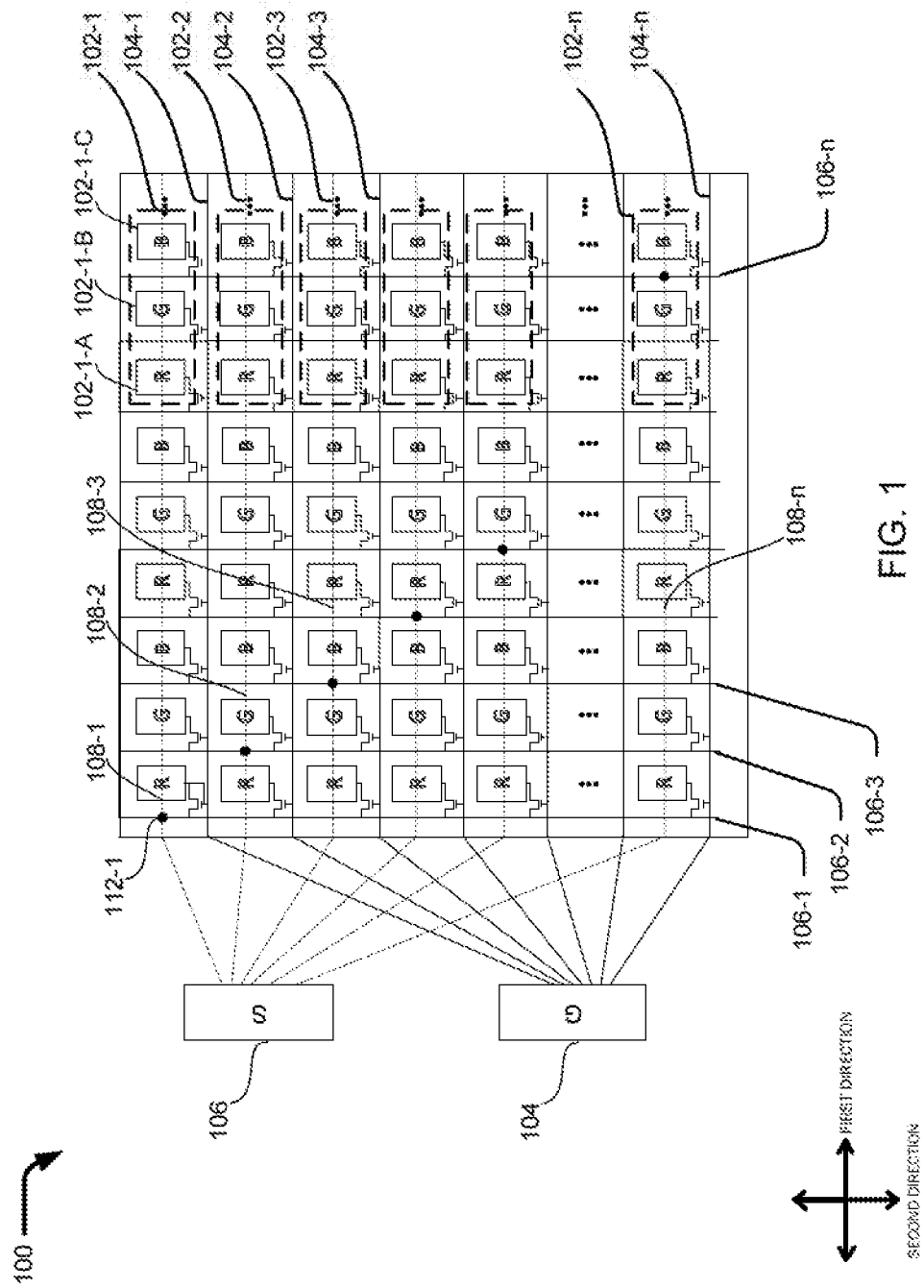
FIG. 1 schematically illustrates a configuration of a liquid crystal display (LCD) device, according to an example implementation of the present subject matter.

A liquid crystal display (LCD) device generally includes one or more LCD panels along with multiple driving elements, such as circuit drivers, timing controllers and one or more image processor(s) for processing video signals and driving the LCDs. An LCD panel generally includes multiple sub-pixels arranged in a plurality of rows and columns to form a matrix. The LCD panel is integrated with driving circuits, such as a source driver and a gate driver. A source driver may provide data signals to the sub-pixels of the LCD panel via multiple source lines arranged parallel to each other and a gate driver may provide gate signals to the sub-pixels of the LCD panel via multiple gate lines arranged parallel to each other.

The source lines and the gate lines are generally arranged in orthogonal directions in the LCD panel. For example, if the source lines are arranged along the column direction of the matrix of sub-pixels, the gate lines are arranged along the row direction of the matrix of sub-pixels, and vice-versa. Thus, each sub-pixel of the LCD panel is surrounded by two adjacent gate lines and two adjacent source lines.

In a conventional LCD display, due to the arrangement of the source lines and gate lines, the source drivers are positioned on an edge of the LCD panel corresponding to the column direction of the matrix of pixels while the gate drivers are placed on an edge corresponding to the row direction of the matrix of pixels.

Since the driving elements are housed along the LCD panel, it is difficult to reduce the bezel size of an LCD device. However, due to increasing demand of larger display area and smaller size of the LCD device, bezel size of the LCD device is being further reduced. In some cases, to reduce bezel size of an LCD device, gate lead-out lines are integrated into the LCD panel, along with the existing source lines and the gate lines. The multiple gate lead-out lines may be arranged parallel to each other, and in the direction of the source lines. Further, the gate lead-out lines are electrically connected to the gate lines. In such an arrangement, the gate lead-out lines and the source lines are driven by a gate driver and a source driver, respectively, and the gate lines are further driven by the gate lead-out lines.

Since the gate lead-out lines are arranged in the direction of the source lines, the gate driver and the source driver are placed on one edge of the LCD panel, thereby reducing the bezel size of the LCD device. However, since the integration of the gate lead-out lines in the direction of the source lines is done by disposing the gate lead-out lines parallel and adjacent to the source lines, and between each sub-pixel, the arrangement causes a reduction in the aperture ratio of each sub-pixel of the LCD panel. Further, the disposal of the multiple gate lead-out lines reduces the space available for thin film transistors (TFT) and other pixel driving components within the LCD panel.

According to example implementations of the present subject matter, techniques of reducing the bezel size of LCD devices are described. Examples of the techniques described herein can allow reduction in the bezel size of an LCD device, while maintaining the aspect ratio of pixels of an LCD panel.

In an example of the present subject matter, the LCD device may include one or more LCD panels housed in a bezel of the LCD device. An LCD panel of the LCD device may include multiple sub-pixels arranged in a first direction and a second direction, in a matrix arrangement. Further, the LCD panel may include integrated driving circuits, such as a source driver and a gate driver. The gate driver may drive multiple gate lines which extend in the first direction and the source driver may drive source lines which extend in the second direction. Thus, each sub-pixel of the LCD panel may be surrounded by two adjacent gate lines and two adjacent source lines.

The LCD panel may include a Color Filter (CF) substrate, a Thin Film Transistor (TFT) substrate, and a Liquid Crystal (LC) layer sandwiched between the CF substrate and the TFT substrate. The TFT substrate comprises a thin film transistor having a gate electrode, a first semiconductor film disposed over the gate electrode, and a drain electrode and a source electrode disposed on the first semiconductor film. It would be noted that the gate lines are electrically connected to the gate electrode, and the source lines are electrically connected to the source electrode for driving the sub-pixels.

In an implementation of the present subject matter, the LCD panel may further include multiple source lead-out lines. The source lead-out lines may be arranged in the first direction, such that the source lead-out lines are parallel to the gate lines. Further, the source lead-out lines may be electrically connected to the source lines.

The source lead-out lines, in the implementation of the present subject matter, are electrically connected to a source driver and the gate lines are electrically connected to a gate driver, where the source driver and the gate driver are placed at a first side of the LCD panel. In an alternate implementation of the present subject matter, the source driver is placed at the first side of the LCD panel and the gate driver is placed a second side of the LCD panel.

In the implementation of the present subject matter, the sub-pixel may include an electrode. The electrode may include three regions, a first region including a first set of slits extending in one direction, a second region including a second set of slits extending in another direction, and a third region including a boundary of the first set of slits and the second set of slits. In such implementation, a source lead-out line extending in the first direction may extend along the third region of the sub-pixel. That is, the source lead-out line may pass over the sub-pixel, in plan view, through the third region of the electrode.

In another implementation of the present subject matter, instead of the source lead-out lines, the LCD panel may include multiple lead-out lines which may be arranged either in the first direction or in the second direction. That is, the LCD panel may include gate lines extending in the first direction, source lines extending in a second direction, and lead-out lines extending either in the first direction or in the second direction. For instance, the lead-out lines may extend in the first direction, such that the lead-out lines are parallel to the gate lines. In another instance, the lead-out lines may extend in the second direction, such that the lead-out lines are parallel to the source lines.

In another implementation of the present subject matter, the sub-pixel may include an electrode. The electrode may include the three regions, i.e., a first region including the first set of slits extending in one direction, the second region including the second set of slits extending in another direction, and the third region including a boundary of the first set of slits and the second set of slits. Further, in the other implementation of the present subject matter, the multiple lead-out lines may extend along the third region of the electrode. That is, the lead-out lines may pass over the sub-pixel, in plan view, through the third region of the electrode.

It would be noted that if the lead-out lines extend in the first direction, and over the third region of the electrode, the lead-out lines would be parallel to the gate lines, also extending in the first direction. In such a situation, the lead-out lines may be driven by the source driver of the LCD panel, and the lead-out lines may be electrically connected to the source lines.

Similarly, if the lead-out lines extend in the second direction, and over the third region of the electrode, the lead-out lines would be parallel to the source lines, also extending in the second direction. Further, in such a situation, the lead-out lines may be driven by the gate driver of the LCD panel, and the lead-out lines may be electrically connected to the gate lines.

It would be noted that since the lead-out lines go through the third region of the electrode, which does not contribute to the aspect ratio of the sub-pixel, the described techniques of placing the source lines, the gate lines, and the lead-out lines, in the LCD panel, may allow reduction in the bezel size of the LCD device, with little effect on the aspect ratio of the sub-pixels.

The above-described LCD devices and LCD panels are further described with reference to FIG. 1 to FIG. 15 It should be noted that the description and figures merely illustrate the principles of the present subject matter along with examples described herein and, should not be construed as a limitation to the present subject matter. It is thus noted that various arrangements may be devised that, although not explicitly described or shown herein, describe the principles of the present subject matter. Moreover, all statements herein reciting principles, aspects, and examples of the present subject matter, as well as specific examples thereof, are intended to encompass equivalents thereof.

As used herein, the singular forms "a", "an" and "the" are intended to include the plural forms as well, unless the context clearly indicates otherwise. The terms "first" and "second" are for differentiating one element from the other element, and these elements should not be limited by these terms. Although the terms "first", "second", etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present subject matter.

It should be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. It will be also understood that when an element or layer is referred to as being "on", "connected to" or "coupled to" another element or layer, it can be directly on, connected or coupled to the other element or layer or intervening elements or layers may be present. Like numbers refer to like elements throughout. As used herein, the term "and/or" includes any and all combinations of one or more of the associated listed items.

Also, spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the elements in use or operation in addition to the orientation depicted in the figures.

FIG. 1 schematically illustrates a configuration of an LCD panel 100 of an LCD device, according to an example implementation of the present subject matter. The LCD panel 100 has multiple pixels 102-1, 102-2, 102-3, . . . , 102-n, arranged in a first direction and a second direction in form of a matrix, to display an image. The pixels 102-1, 102-2, 102-3, . . . , 102-n have been commonly referred to as pixels 102, hereinafter. Further, each pixel 102-1, 102-2, 102-3, . . . , 102-n may include sub-pixels, such as 102-1-A, 102-1-B, and 102-1-C. The LCD panel 100 may further include multiple gate lines 104-1, 104-2, 104-3, . . . , 104-n extending in the first direction, and substantially parallel to each other, and multiple source lines 106-1, 106-2, 106-3, . . . , 106-n extending in the second direction, and substantially parallel to each other. The LCD panel 100 may further include multiple source lead-out lines 108-1, 108-2, 108-3, . . . , 108-n extending in the first direction, and parallel to the gate lines 104-1, 104-2, 104-3, . . . , 104-n. In an example of the present subject matter, the multiple source lead-out lines 108-1, 108-2, 108-3, . . . , 108-n may be substantially parallel to each other.

The LCD panel 100 may also include a gate driver 104 to drive the gate lines 104-1, 104-2, 104-3, . . . , 104-n extended in the first direction, and a source driver 106 to drive the source lead-out lines 108-1, 108-2, 108-3, . . . , 108-n. Further, a source lead-out line from amongst the multiple source lead-out lines 108-1, 108-2, 108-3, . . . , 108-n may be electrically connected to one or more source lines 106-1, 106-2, 106-3, . . . , 106-n through one or more contact points. For example, the source lead-out line 108-1 may be electrically connected to the source line 106-1 through a contact point 112-1.

As explained earlier, each sub-pixel, such as the sub-pixel is arranged in a section between intersection of two adjacent gate lines, such as the gate lines 104-1 and 104-2, and two adjacent source lines, such as source lines 106-1 and 106-2.

Figure 2:
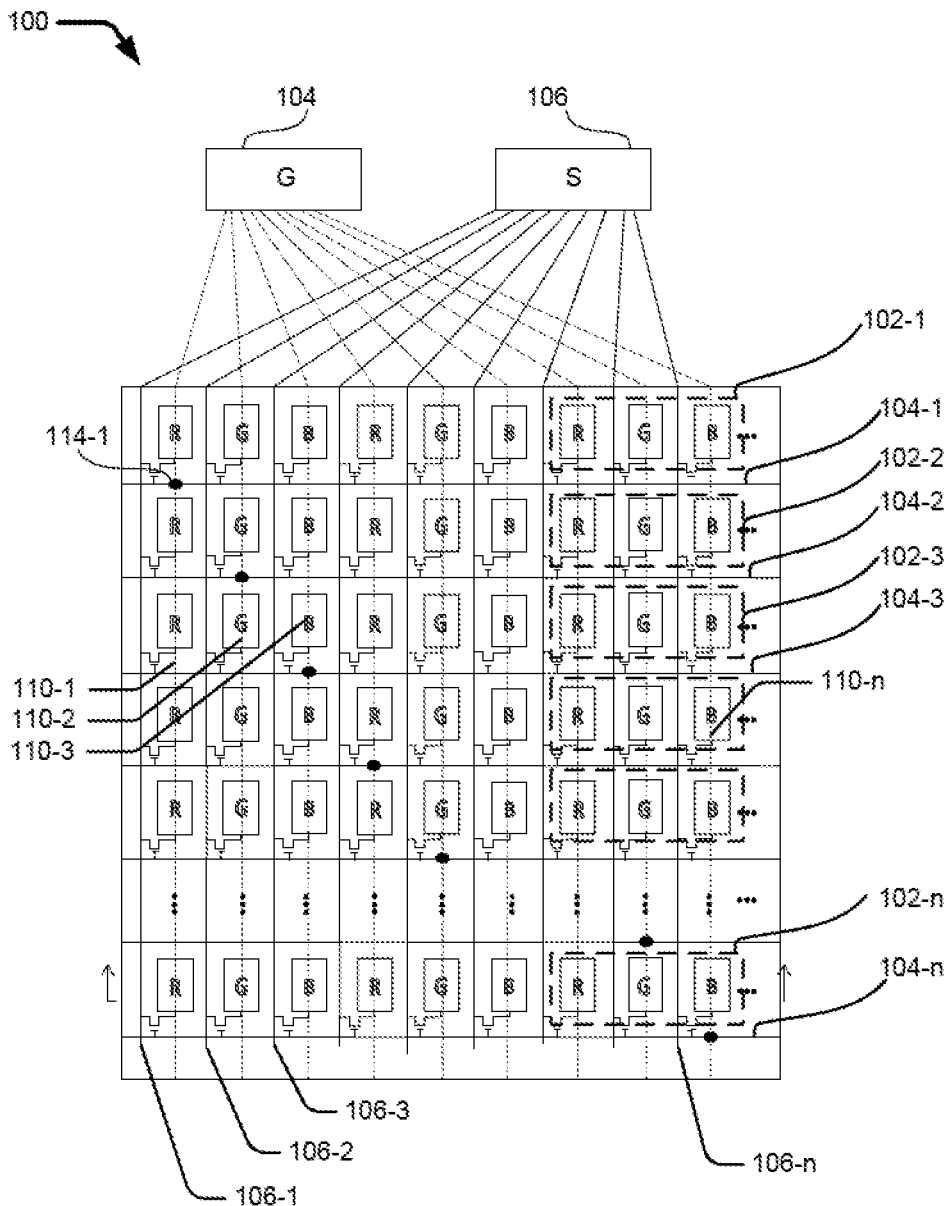
FIG. 2 schematically illustrates another configuration of a liquid crystal display (LCD) device, according to an example implementation of the present subject matter.

FIG. 2 schematically illustrates another configuration of the LCD panel 100, according to an example implementation of the present subject matter. The LCD panel 100 may include multiple gate lines 104-1, 104-2, 104-3, . . . , 104-n extending in the first direction, and substantially parallel to each other, and multiple source lines 106-1, 106-2, 106-3, . . . , 106-n extending in the second direction, and substantially parallel to each other. The LCD panel 100 may further include multiple gate lead-out lines 110-1, 110-2, 110-3, . . . , 110-n extending in the second direction, and parallel to the source lines 106-1, 106-2, 106-3, . . . , 106-n. In an example of the present subject matter, the multiple gate lead-out lines 110-1, 110-2, 110-3, . . . , 110-n may be substantially parallel to each other.

In an example of the present subject matter, the gate driver 104 may drive the gate lead-out lines 110-1, 110-2, 110-3, . . . , 110-n extended in the second direction and the source driver 106 may drive the source lines 106-1, 106-2, 106-3, . . . , 106-n extended in the first direction. Further, a gate lead-out line from amongst the multiple gate lead-out lines 110-1, 110-2, 110-3, . . . , 110-n may be electrically connected to one or more gate lines 104-1, 104-2, 104-3, . . . , 104-n through one or more contact points. For example, the gate lead-out line 110-1 may be electrically connected to the gate line 104-1 through a contact point 114-1. Further, the arrangement of a sub-pixel 102-1-A and its elements is further described in reference to FIG. 3A and FIG. 3B, for the ease of explanation.

Figure 3A:
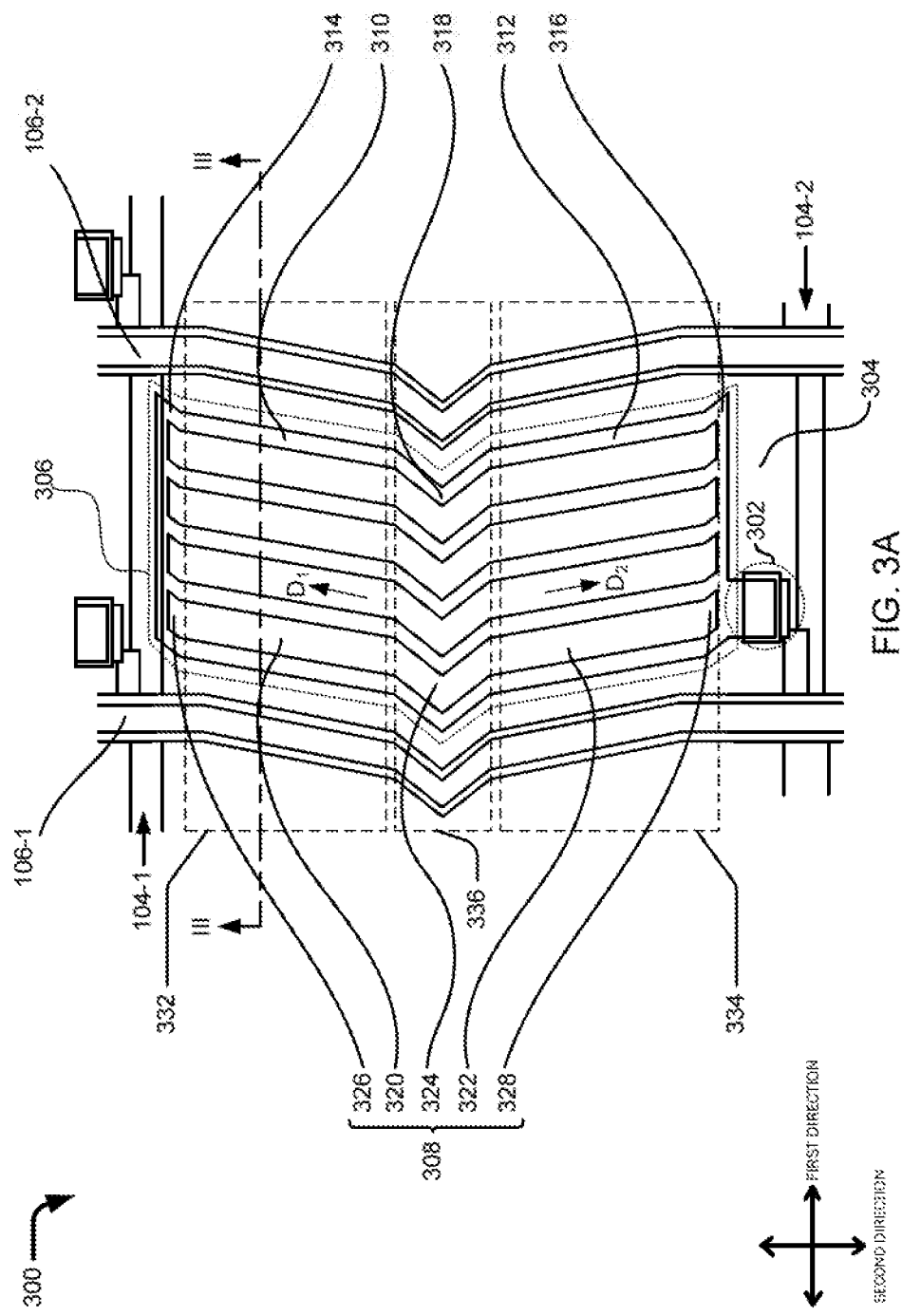
FIG. 3A illustrates a plan view of a sub-pixel, according to an example implementation of the present subject matter.

Referring to FIG. 3A, a schematic representation of a sub-pixel 300, in plan view, has been described. As described earlier, the sub-pixel 300 is included within the intersection of two adjacent gate lines and two adjacent source lines, such as within the intersection of two adjacent gate lines 104-1 and 104-2, and two adjacent source lines 106-1 and 106-2. The sub-pixel 300 may be a part of any of the pixels 102 of the LCD panel 100. In an example of the present subject matter, the sub-pixel 300 is bounded by two source lines 106-1 and 106-2, and two gate lines 104-1 and 104-2.

In operation, the sub-pixel 300, may also include various other elements and or layers, such as a color filter (CF) layer (not shown) and a liquid crystal (LC) layer (not shown), however, such elements and layers have not been shown and explained for the sake of brevity.

Further, the sub-pixel 300 may include a thin film transistor (TFT) 302, a common electrode 304, and insulating layer (not shown) formed on the common electrode 304, and sub-pixel electrode 306 formed on the insulating layer. In an example of the present subject matter, the common electrode 304 is made of a transparent material, such as indium-tin oxide, indium-zinc oxide. Further, in an example of the present subject matter, a sub-pixel electrode 306 is made of a transparent material, for example, indium-tin oxide. In an example of the present subject matter, the sub-pixel electrode 306 may include multiple slits 308 formed in parallel with each other.

In an example of the present subject matter, the sub-pixel electrode 306 may include multiple linear portions 310 and 312 formed in parallel with each other, connecting portions 314 and 316 connecting the linear portions to each other, and a slanted portion 318 that connects the linear portions 310 and 312 to each other and is formed of two straight portions combined in a V shape. Further, each slit 308 formed within the sub-pixel electrode 306 may have a symmetrical shape in direction $D_1$ and direction $D_2$, and include straight portions (first portions) 320 and 322, a portion (V portion) 324 that connects the first portions 320 and 322 to each other and is formed of two straight portions combined in a V shape. Furthermore, each slit 308 may also include linear portions (second portions) 326 and 328 respectively provided between the first portion 320 and the connecting portion 314, and the first portion 322 and the connecting portion 316.

As mentioned above, each slit 308 bends between the second portion 326 and the first portion 320, between the first portion 320 and the V portion 324, between the first portion 322 and the V portion 324, and between the first portion 322 and the second portion 328. In addition, the V portion 324 has one bent portion. Accordingly, each slit 308 has five bent portions.

The V portion 324 and the second portions 326 and 328 are subsidiary portions. The alignment of most liquid crystal molecules in the LC layer is controlled in regions including the first portions 320 and 322. The rotation direction of liquid crystal molecules in the region including the first portion 320 is opposite from that in the region including the first portion 322, and therefore, the alignments of liquid crystal molecules collide with each other between the regions. For facilitating the alignment of liquid crystal molecules between the regions, the V portion 324 is provided between the first portions 320 and 322.

Near the connecting portions 314 and 316, the alignment of liquid crystal molecules may be disturbed by the electric field generated from the connecting portions 314 and 316, respectively. For suppressing alignment disorder of liquid crystal molecules near the connecting portions 314 and 316, the second portions 326 and 328 are respectively provided. That is, the second portion 326 is provided between the connecting portion 314 and the first portion 320. Similarly, the second portion 328 is provided between the first portion 322 and the connecting portion 316.

As a result, even when a local pressure is applied to the screen of the liquid crystal display from outside (e.g., when the screen is pressed by fingers) to cause locally disordered alignment of liquid crystal molecules, namely, locally disturbed display, such a defect can be quickly recovered.

In an example of the present subject matter, the common electrode 304 may be facing towards the slits 308, and control of the voltage to be applied between the sub-pixel electrode 306 and the common electrode 304 may allow control of alignment of liquid crystal molecules, more specifically, rotation of liquid crystal molecules.

Also, since the alignment disorder of liquid crystal molecules near the connecting portions 314 and 316 may be disturbed by the electric field generated from the connecting portions 314 and 316, the connecting portions 314 and 316 do not contribute to the aperture ratio of the sub-pixel 300. Similarly, since the V portion 324 is provided to facilitate the alignment of liquid crystal molecules between the first regions in the direction $D_1$ and the direction $D_2$, the third region 336 does not contribute to the aperture ratio of the sub-pixel 300.

In an example of the present subject matter, for the ease of explanation, the region of the sub-pixel electrode 306 extending in the direction $D_1$ has been referred to as a first region 332, the region of the sub-pixel electrode 306 extending in the second direction $D_2$ has been referred to as a second region 334, and the region including the slanted portion 318 of the sub-pixel electrodes 306 has been referred to as a third region 336, hereinafter. It would be noted that the first region 332 is a part of the sub-pixel electrode 306 where the first portion 320 of each slit 308 is formed and the second region 334 is a part of the sub-pixel electrode 306 where the second portion 328 of each slit 308 is formed. Further, the third region 336 is a part of the sub-pixel electrode 306 where the V portion 324 of each slit 308 is formed. Therefore, the first region 332 can be understood to include a first set of slits extending in the direction $D_1$, the second region can be understood to include a second set of slits extending in the direction $D_2$, and the third region can be understood to include boundary of the first set of slits and the second set of slits.

FIG. 3B illustrates a cross sectional view of a sub-pixel along line III-III of FIG. 3A, according to an example implementation of the present subject matter.

FIG. 3B shows a LC layer 352 between a upper substrate 354 and a lower substrate 356. The upper substrate 354 and the lower substrate 356 are made of a transparent material, such as glass or transparent plastic. The LC layer 352 includes liquid crystal molecules 358. A first polarizer 360 is disposed on an outer surface of the upper substrate 354, and a second polarizer 362 is disposed on an outer surface of the lower substrate 356, as shown in FIG. 3B. The first polarizer 360 and the second polarizer 362 are disposed such that their polarization axes are perpendicular to each other.

Further, a first alignment layer 364 and a second alignment layer 366 are disposed on both sides of the liquid crystal layer 352. The first alignment layer 364 and the second alignment layer 366 are for fixing the alignment of the liquid crystal molecules 358 in the liquid crystal layer 352. The first and second alignment layers 364 and 366 may be made of a polyamide.

Further, as shown in FIG. 3B, a color filter 368 is formed on the upper substrate 354. The color filter 368 includes pigments of red, green, or blue color, depending on the colored light emitted by the sub-pixel 300. An overcoat layer 370 is coated on the color filter 368. The overcoat layer 370 prevents pigments from releasing out to the LC layer 352.

Further, a gate insulating layer 372 is formed on an inner surface of the lower substrate 356. The gate insulating layer 372 covers the gate lines 104-1 and 104-2 shown in FIG. 3A. The gate insulating layer 372 may be formed of silicon nitride (SiN), silicon dioxide ($SiO_2$), or alumina. As shown in FIG. 3B, source lines 106-1 and 106-2 are on the gate insulating layer 372. A protective insulating layer 374 is formed to cover the source lines 106-1 and 106-2. The protective insulating layer 374 may be formed of silicon nitride (SiN) or silicon dioxide ($SiO_2$). Further, an organic protective insulating layer 378 is formed on the protective insulating layer 374. The organic protective insulating layer 378 is a photosensitive resist and is made of an acrylic material.

Further, as shown in FIG. 3B, a common electrode 304 is formed on the organic protective insulating layer 378. The common electrode 304 is made of a transparent material, such as indium-tin oxide, indium-zinc oxide. An upper portion insulating layer 380 is formed on the common electrode 304. The upper portion insulating layer 380 is made of silicon nitride (SiN) or silicon dioxide ($SiO_2$).

Further, as shown, the sub-pixel electrode 306 is formed on the upper portion insulating layer 380. The linear portions 310 of the electrode 306 are visible in the cross-sectional view in FIG. 3B. Further, a black matrix 376 is formed on an inner side of the upper substrate 354. The black matrix 376 prevents mixing of colors displayed by sub-pixels adjacent to the sub-pixel 300.

Figure 4:
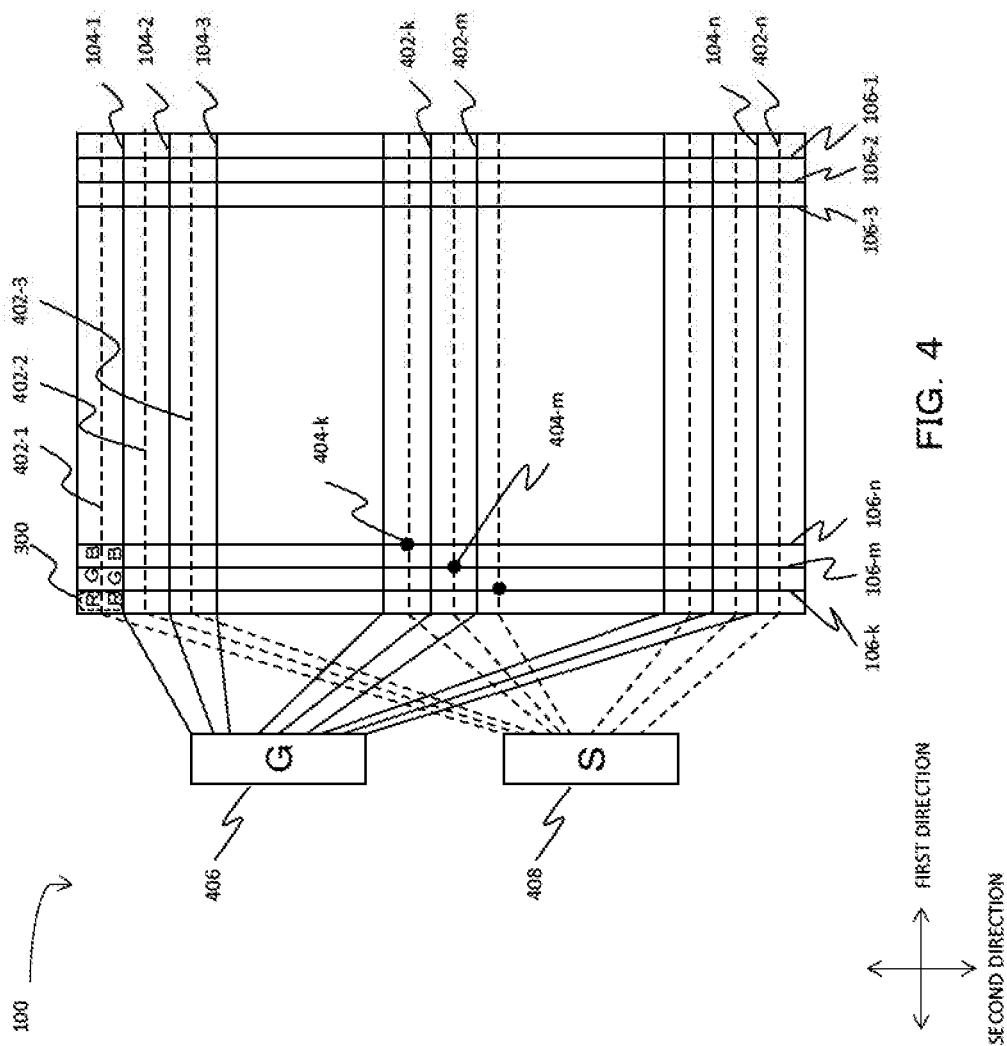
FIG. 4 depicts a schematic representation of the LCD panel in plan view according to an example implementation of the present subject matter.

FIG. 4 depicts a schematic representation of the LCD panel 100, according to an example implementation of the present subject matter. This figure shows a simpler plan configuration of FIG. 1. As described earlier, the LCD panel 100 of the present subject matter includes the multiple gate lines 104-1, 104-2, 104-3, . . . , 104-*n* extending in the first direction. Further, the LCD panel 100 also includes multiple source lines 106-1, 106-2, 106-3, . . . , 106-*n* extending in the second direction.

Further, the LCD panel 100 also includes lead-out lines. In an example of the present subject matter, the LCD panel 100 may include source lead-out lines 402-1, 402-2, 402-3, . . . , 402-*n* extend in the first direction, and parallel to the gate lines 104-1, 104-2, 104-3, . . . , 104-*n*. That is, in the LCD panel 100, the gate lines 104-1, 104-2, 104-3, . . . , 104-*n* and the source lead-out lines 402-1, 402-2, 402-3, . . . , 402-*n* may extend in the first direction and the source lines 106-1, 106-2, 106-3, . . . , 106-*n* may extend in the second direction.

In an example of the present subject matter, the source lead-out lines 402-1, 402-2, 402-3, . . . , 402-*n* are electrically connected to one or more source lines 106-1, 106-2, 106-3, . . . , 106-*n*. For instance, the source lead-out line 402-*k* may be electrically connected with the source line 106-*k* through a contact point 404-*k*, and the source lead-out line 402-*m* may be electrically connected with the source line 106-*m* through a contact point 404-*m*. Further, the gate lines 104-1, 104-2, 104-3, . . . , 104-*n* may be driven by a gate driver 406 and the source lead-out lines 402-1, 402-2, 402-3, . . . , 402-*n* may be driven by a source driver 408.

It would be noted that the arrangement of the gate lines 104-1, 104-2, 104-3, ..., 104-n, the source lines 106-1, 106-2, 106-3, ..., 106-n, and the source lead-out lines 402-1, 402-2, 402-3, ..., 402-n allows placement of the gate driver 406 and source driver 408 on one side of the LCD panel 100, thereby reducing the bezel size of the LCD device.

It would be appreciated by those skilled in the art that the gate lines extend in the first direction, to provide gate signals to the sub-pixel, and the source lines extend in the second direction, providing source signals to the sub-pixels. In an example, one gate line and three source lines are utilized to provide gate and source signals to a pixel, respectively. In the implementation of the present subject matter where source lead-out lines are electrically connected to the source lines through contact points, at least one source lead-out line may be utilized to electrically connect to a source line. Accordingly, in the described implementation of the present subject matter, the number of pixels in the second direction may be three times the number of pixels in the first direction. That is, if the LCD panel 100 includes '360' pixels arranged in the first direction, the LCD panel 100 may include '1080' pixels in the second direction.

As described earlier, the sub-pixel electrode 306 of the LCD panel 100 may include the described three regions 332, 334, and 336 and the source lead-out lines 402-1, 402-2, 402-3, ..., 402-n may extend along the third region 336 of the sub-pixel electrode 306. In plan view, the source lead-out lines 402-1, 402-2, 402-3, ..., 402-n are formed over the third region 336 of the sub-pixel electrode 306. As described earlier, the third region 336 of the sub-pixel electrode 306 may not contribute to the aspect of the sub-pixel 300 so much, and accordingly, formation of the source lead-out lines 402-1, 402-2, 402-3, ..., 402-n in the third region 336 may not reduce the aperture ratio of the sub-pixel 300.

Figure 5:
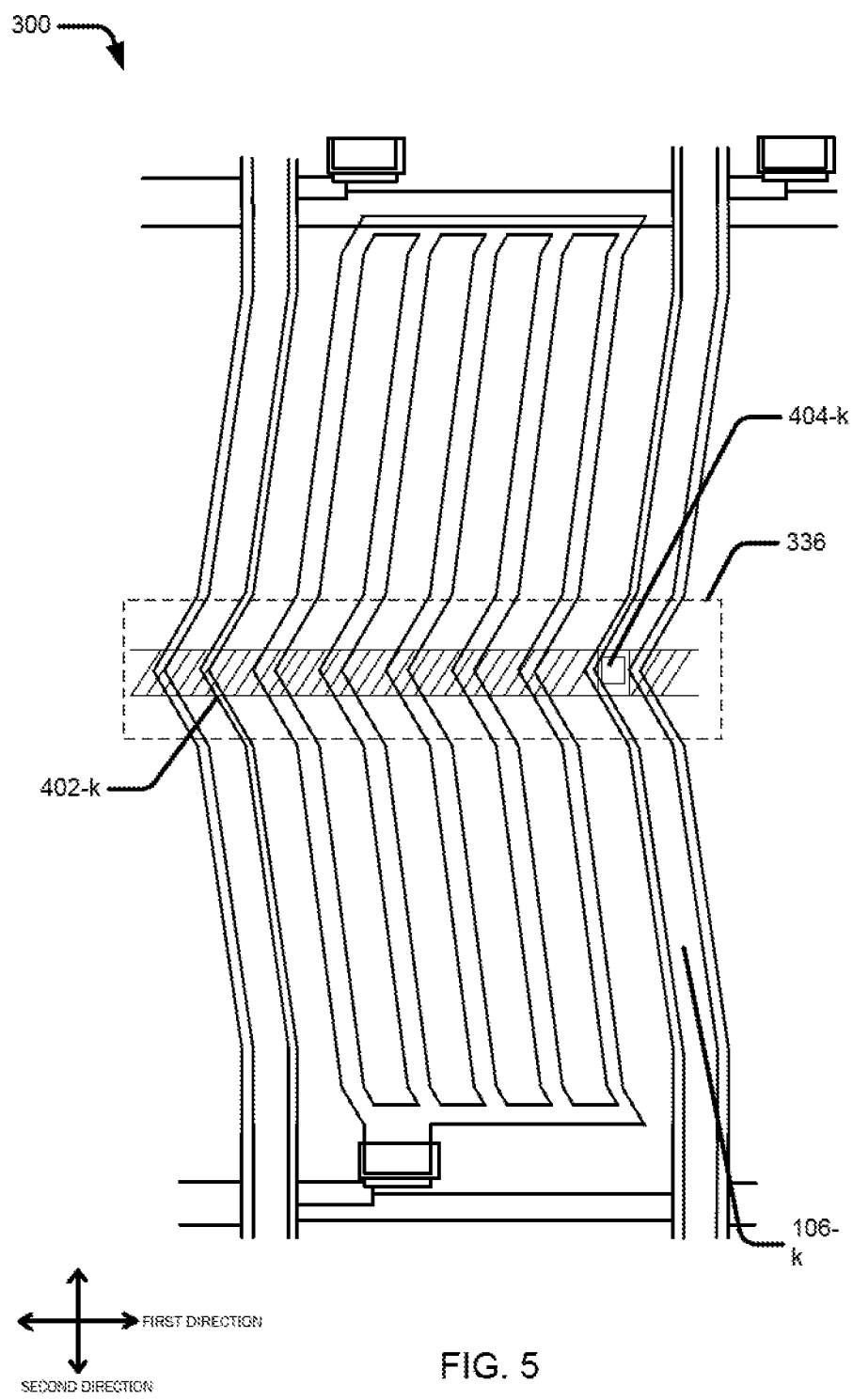
FIG. 5 schematically depicts a plan view of a sub-pixel, according to an example implementation of the present subject matter.

FIG. 5 schematically depicts a plan view of the sub-pixel 300, according to an example implementation of the present subject matter. In an example of the present subject matter, a source lead-out line 402-k extends in the first direction, along the third region 336 of the sub-pixel electrode 306. Further, the source lead-out line 402-k is also electrically connected to a source line 106-k through a contact point 404-k. In implementation, a through hole may be formed in an insulating layer between the source lead-out line 402-k and the source line 106-k at the contact point 404-k, thereby electrically connecting the source lead-out line 402-k with the source line 106-k.

In one example, the source lead-out lines 402-1, 402-2, 402-3, ..., 402-n and the gate lines 104-1, 104-2, 104-3, ..., 104-n may be formed in a same layer, made of metal, such as copper (Cu) and aluminum (Al), during fabrication. That is, during the fabrication of the sub-pixel 300, while the gate lines 104-1, 104-2, 104-3, ..., 104-n are formed in a layer, the source lead-out lines 402-1, 402-2, 402-3, ..., 402-n may also be formed in the same layer, such that the gate lines 104-1, 104-2, 104-3, ..., 104-n and the source lead-out lines 402-1, 402-2, 402-3, ..., 402-n are parallel to each other. It would be noted that while the gate lines 104-1, 104-2, 104-3, ..., 104-n and the source lead-out lines 402-1, 402-2, 402-3, ..., 402-n are formed in a same layer and are parallel to each other, the gate lines 104-1, 104-2, 104-3, ..., 104-n and the source lead-out lines 402-1, 402-2, 402-3, ..., 402-n may be electrically insulated from each other, by a variety of insulating materials, such as Silicon Nitride (SiN) or Silicon Dioxide ($SiO_2$).

In another example, the source lead-out lines 402-1, 402-2, 402-3, ..., 402-n and the gate lines 104-1, 104-2, 104-3, ..., 104-n may be formed in different layers, during fabrication. That is, during the fabrication of the sub-pixel 300, while the gate lines 104-1, 104-2, 104-3, ..., 104-n are formed in one layer, the source lead-out lines 402-1, 402-2, 402-3, ..., 402-n may be formed in another layer, where the gate lines 104-1, 104-2, 104-3, ..., 104-n and the source lead-out lines 402-1, 402-2, 402-3, ..., 402-n are substantially parallel to each other.

As described earlier, the implementation of the above-described techniques may include three times the number of pixels in the second direction as compared to the number of pixels in the first direction. However, in an alternate implementation, to change the pixel ratio in the first direction and the second direction, two or more source lead-out lines 402-1, 402-2, 402-3, ..., 402-n may extend along the third region 336 of the sub-pixel electrode 306. The aspect of at least two source lead-out lines 402-1, 402-2, 402-3, ..., 402-n extending along the third region 336 of the sub-pixel electrode 306 has been further described in reference of FIG. 6 and FIG. 7.

Figure 6:
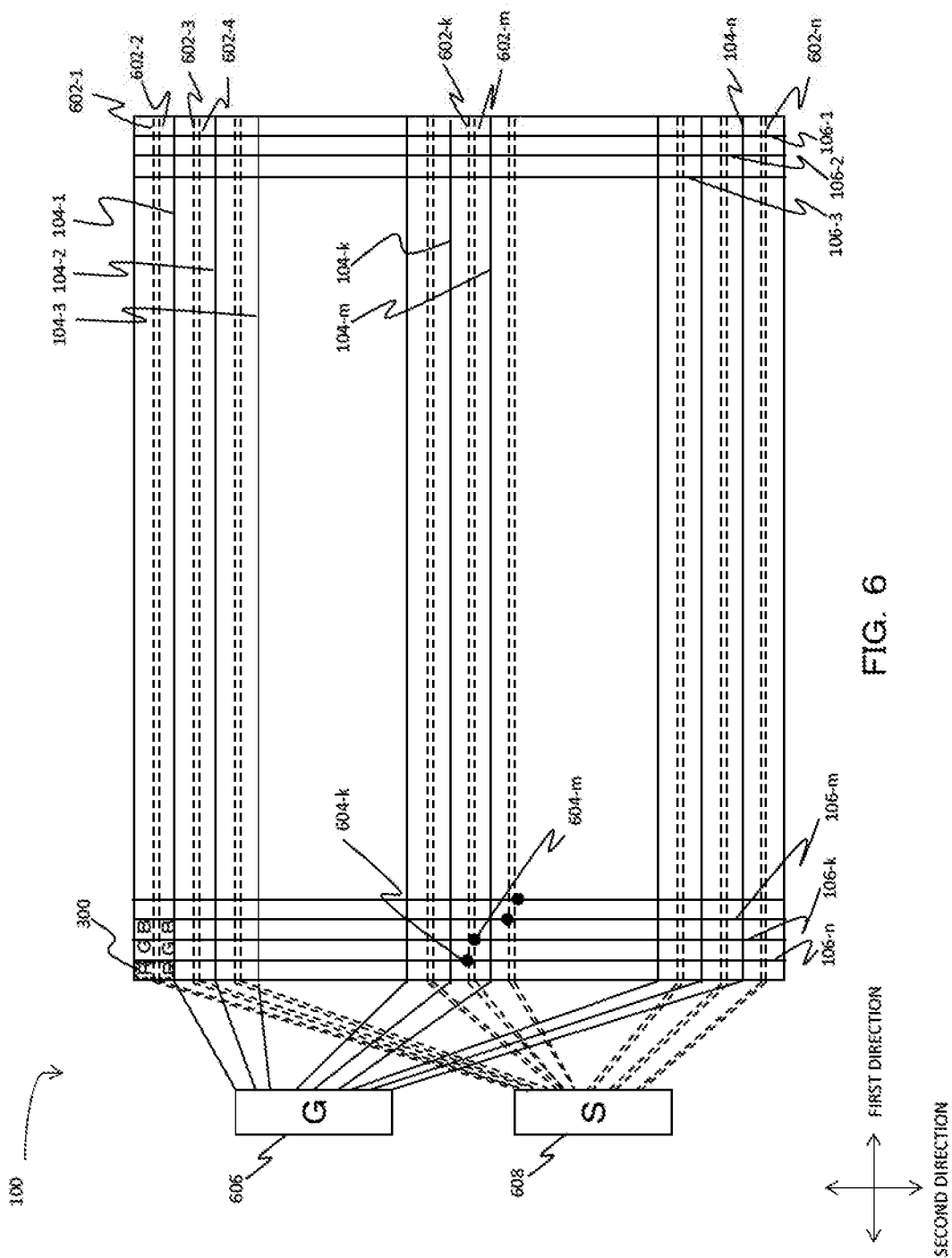
FIG. 6 depicts a schematic representation of the LCD panel, according to another example implementation of the present subject matter.

FIG. 6 depicts a schematic representation of the LCD panel 100, according to an example implementation of the present subject matter. The LCD panel 100 may include multiple source lead-out lines 602-1, 602-2, 602-3, ..., 602-n, extending in the first direction along with the gate lines 104-1, 104-2, 104-3, ..., 104-n extending in the first direction and the source lines 106-1, 106-2, 106-3, ..., 106-n extending in the second direction. Further, in the said implementation of the present subject matter, at least two source lead-out lines 602-1, 602-2, 602-3, 602-4, ..., 602-n are formed between two adjacent gate lines 104-1, 104-2, 104-3, ..., 104-n.

For example, two source lead-out lines 602-k, 602-m may be formed between two adjacent gate lines 104-k and 104-m. It would be noted that while formation of two source lead-out lines 602-1, 602-2, 602-3, 602-n has been described between two adjacent gate lines 104-1, 104-2, 104-3, ..., 104-n, multiple source lead-out lines 602-1, 602-2, 602-3, ..., 602-n may also be formed between two adjacent gate lines lines 104-1, 104-2, 104-3, ..., 104-n, in different implementations.

In an example of the present subject matter, the source lead-out lines 602-1, 602-2, 602-3, ..., 602-n are electrically connected to one or more source lines 106-1, 106-2, 106-3, ..., 106-n. For instance, the source lead-out line 602-k may be electrically connected with the source line 106-k through a contact point 604-k, and the source lead-out line 602-m may be electrically connected with the source line 106-m through a contact point 604-m. Further, gate lines 104-1, 104-2, 104-3, ..., 104-n may be driven by a gate driver 606 and the source lead-out lines 602-1, 602-2, 602-3, ..., 602-n may be driven by a source driver 608.

In an example implementation of the present subject matter, the sub-pixel electrode 306 of the LCD panel 100 may include the described three regions and the source lead-out lines 602-1, 602-2, 602-3, ..., 602-n may extend along the third region 336 of the sub-pixel electrode 306. In plan view, the source lead-out lines 602-1, 602-2, 602-3, ..., 602-n may be formed over the third region 336 of the sub-pixel electrode 306. As described earlier, the third region 336 of the sub-pixel electrode 306 may not contribute to the aspect of the sub-pixel 300 so much, and accordingly, formation of the source lead-out lines 602-1, 602-2, 602-3, ..., 602-n in the third region 336 may not reduce the aperture ratio of the sub-pixel 300.

Figure 7:
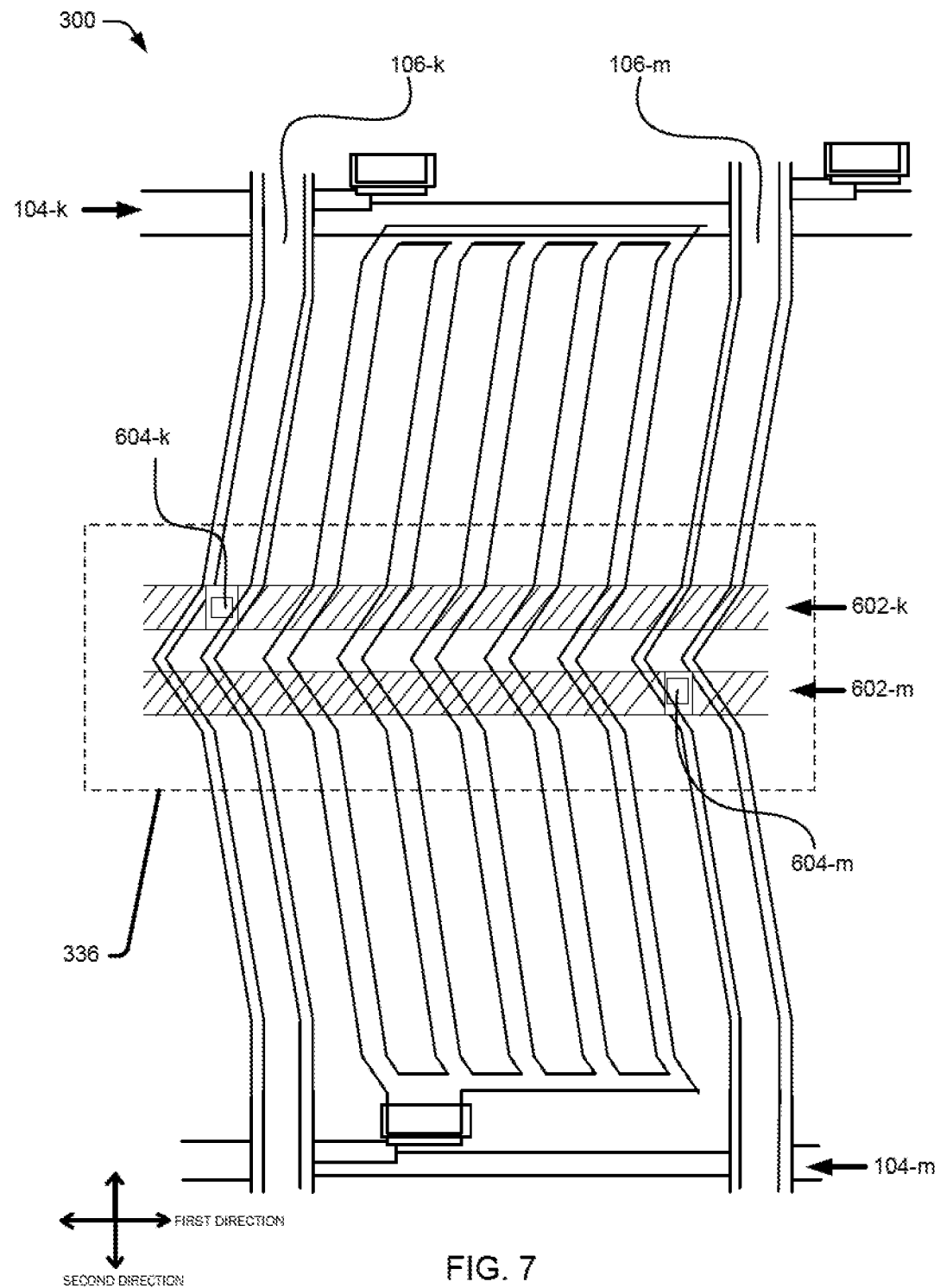
FIG. 7 schematically depicts a plan view of a sub-pixel, according to another example implementation of the present subject matter.

FIG. 7 schematically depicts a plan view of the sub-pixel 300, according to an example implementation of the present subject matter. In an example of the present subject matter, two source lead-out lines, such as the source lead-out lines 602-$k$ and 602-$m$ are formed between two adjacent gate lines, such as the gate lines 104-$k$ and 104-$m$. Further, the source lead-out lines 602-$k$ and 602-$m$ may extend in the first direction, along the third region 336 of the sub-pixel electrode 306. Furthermore, the source lead-out line 602-$k$ may be electrically connected with the source line 106-$k$ through the contact point 604-$k$, and the source lead-out line 602-$m$ may be electrically connected with the source line 106-$m$ through the contact point 604-$m$. In an implementation, a through hole may be formed in an insulating layer between the source lead-out line 602-$k$ and the source line 106-$k$ at the contact point 604-$k$, thereby electrically connecting the source lead-out line 602-$k$ with the source line 106-$k$. Similarly, a through hole may be formed in an insulating layer between the source lead-out line 602-$m$ and the source line 106-$m$ at the contact point 604-$m$, thereby electrically connecting the source lead-out line 602-$m$ with the source line 106-$m$.

Since in the described implementation of the present subject matter, two source lead-out lines 602-1, 602-2, 602-3, ..., 602-$n$ may extend along the third region 336 of the sub-pixel electrode 306, the pixel ratio in the first direction and the second direction may change from 1:3 to 2:3. For example, if the LCD panel 100 includes '720' pixels arranged in the first direction, the LCD panel 100 may include '1080' pixels in the second direction.

In one example, the source lead-out lines 602-$k$, and 602-$m$, and the gate lines 104-$k$ and 104-$m$ may be formed in a same layer, during fabrication. That is, during the fabrication of the sub-pixel 300, while the gate lines 104-$k$ and 104-$m$ are formed in a layer, the source lead-out lines 602-$k$, and 602-$m$ may also be formed in the same layer, such that the gate lines 104-$k$ and 104-$m$ and the source lead-out lines 602-$k$ and 602-$m$ are parallel to each other. It would be noted that while the gate lines 104-$k$ and 104-$m$ and the source lead-out lines 602-$k$ and 602-$m$ are formed in a same layer and are parallel to each other, the gate lines 104-$k$ and 104-$m$ and the source lead-out lines 602-$k$ and 602-$m$ may be electrically insulated from each other by a variety of insulating materials, such as Silicon Nitride (SiN) or Silicon Dioxide (SiO$_2$).

In another example, the source lead-out lines 602-$k$ and 602-$m$ and the gate lines 104-$k$ and 104-$m$ may be formed in different layers, during fabrication. That is, during the fabrication of the sub-pixel 300, while the gate lines 104-$k$ and 104-$m$ is formed in one layer, the source lead-out lines 602-$k$ and 602-$m$ may be formed in another layer, where the gate lines 104-$k$ and 104-$m$ and the source lead-out lines 602-$k$ and 602-$m$ are substantially parallel to each other.

Figure 8:
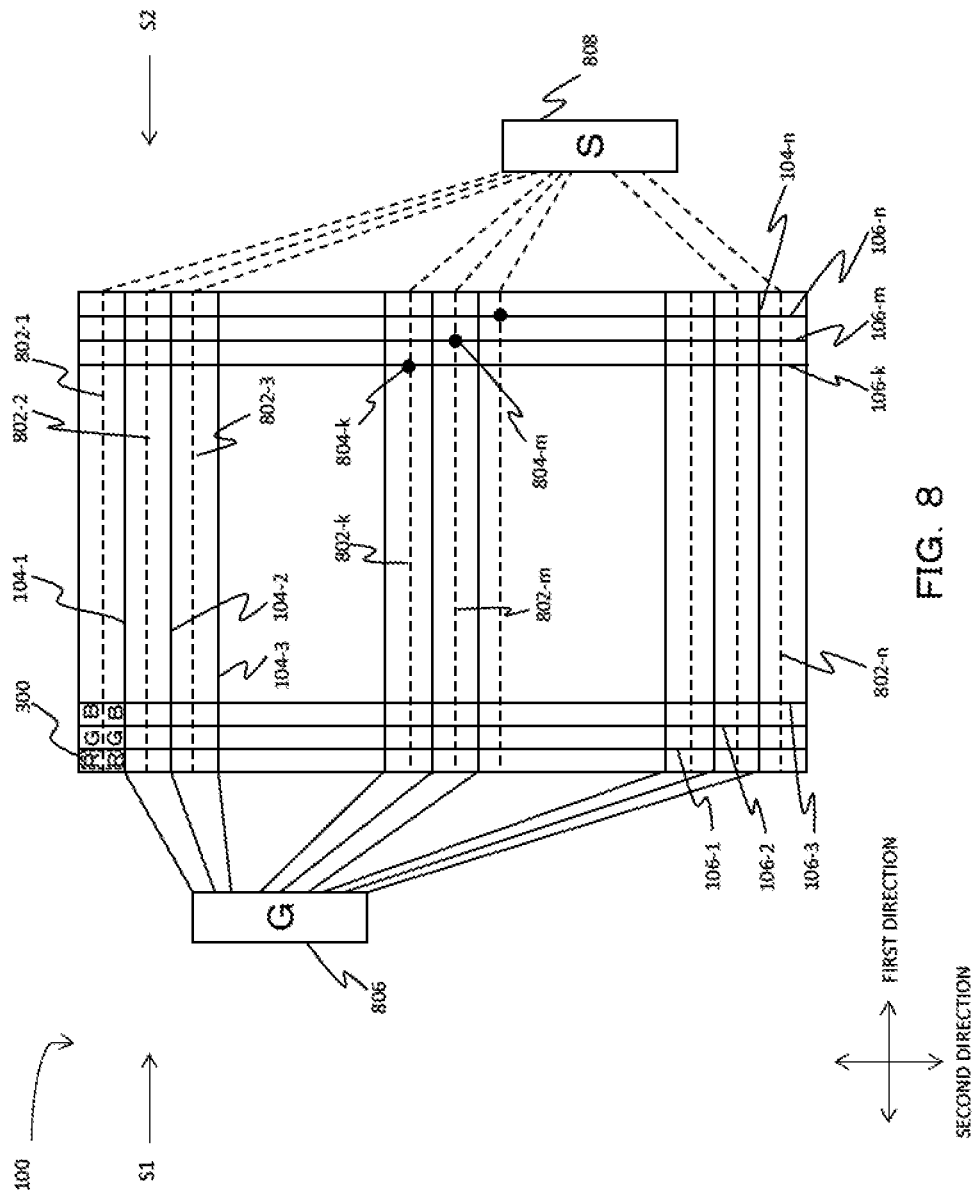
FIG. 8 depicts a schematic representation of the LCD panel, according to another example implementation of the present subject matter.

FIG. 8 depicts a schematic view of the LCD panel 100, according to an example implementation of the present subject matter. In an implementation of the present subject matter, the LCD panel 100 may include multiple source lead-out lines 802-1, 802-2, 802-3, ..., 802-$n$, extending in the first direction along with the gate lines 104-1, 104-2, 104-3, ..., 104-$n$ extending in the first direction and the source lines 106-1, 106-2, 106-3, ..., 106-$n$ extending in the second direction. As described earlier, the source lead-out lines 802-1, 802-2, 802-3, ..., 802-$n$ may be substantially parallel to each other, and also parallel to the gate lines 104-1, 104-2, 104-3, ..., 104-$n$.

In an example of the present subject matter, the gate lines 104-1, 104-2, 104-3, ..., 104-$n$ may be driven by a gate driver 806 placed at first side (S$_1$) of the LCD panel 100, and the source lead-out lines 802-1, 802-2, 802-3, ..., 802-$n$ may be driven by a source driver 808 placed at a second side (S$_2$) of the LCD panel 100. As depicted in FIG. 8, the source driver 808 and the gate driver 806 may be placed opposite to each other to drive the source lead-out lines 802-1, 802-2, 802-3, ..., 802-$n$, and the gate lines 104-1, 104-2, 104-3, ..., 104-$n$, respectively.

Further, in an example of the present subject matter, each of the source lead-out lines 802-1, 802-2, 802-3, ..., 802-$n$ may be electrically connected to one or more of the source lines 106-1, 106-2, 106-3, ..., 106-$n$ through contact points. For example, the source lead-out line 802-$k$ may be electrically connected to the source line 106-$k$ through a contact point 804-$k$. Similarly, the source lead-out line 802-$m$ may be electrically connected to the source line 106-$m$ through a contact point 804-$m$.

As described earlier, in an example of the present subject matter, the source lead-out lines 802-1, 802-2, 802-3, ..., 802-$n$ may extend along the third region 336 of the sub-pixel electrode 306. In plan view, the source lead-out lines 802-1, 802-2, 802-3, ..., 802-$n$ are formed over the third region 336 of the sub-pixel electrode 306. As described earlier, the third region 336 of the sub-pixel electrode 306 may not contribute to the aspect of the sub-pixel 300 so much, and accordingly, formation of the source lead-out lines 802-1, 802-2, 802-3, ..., 802-$n$ in the third region 336 may not reduce the aperture ratio of the sub-pixel 300.

Figure 9:
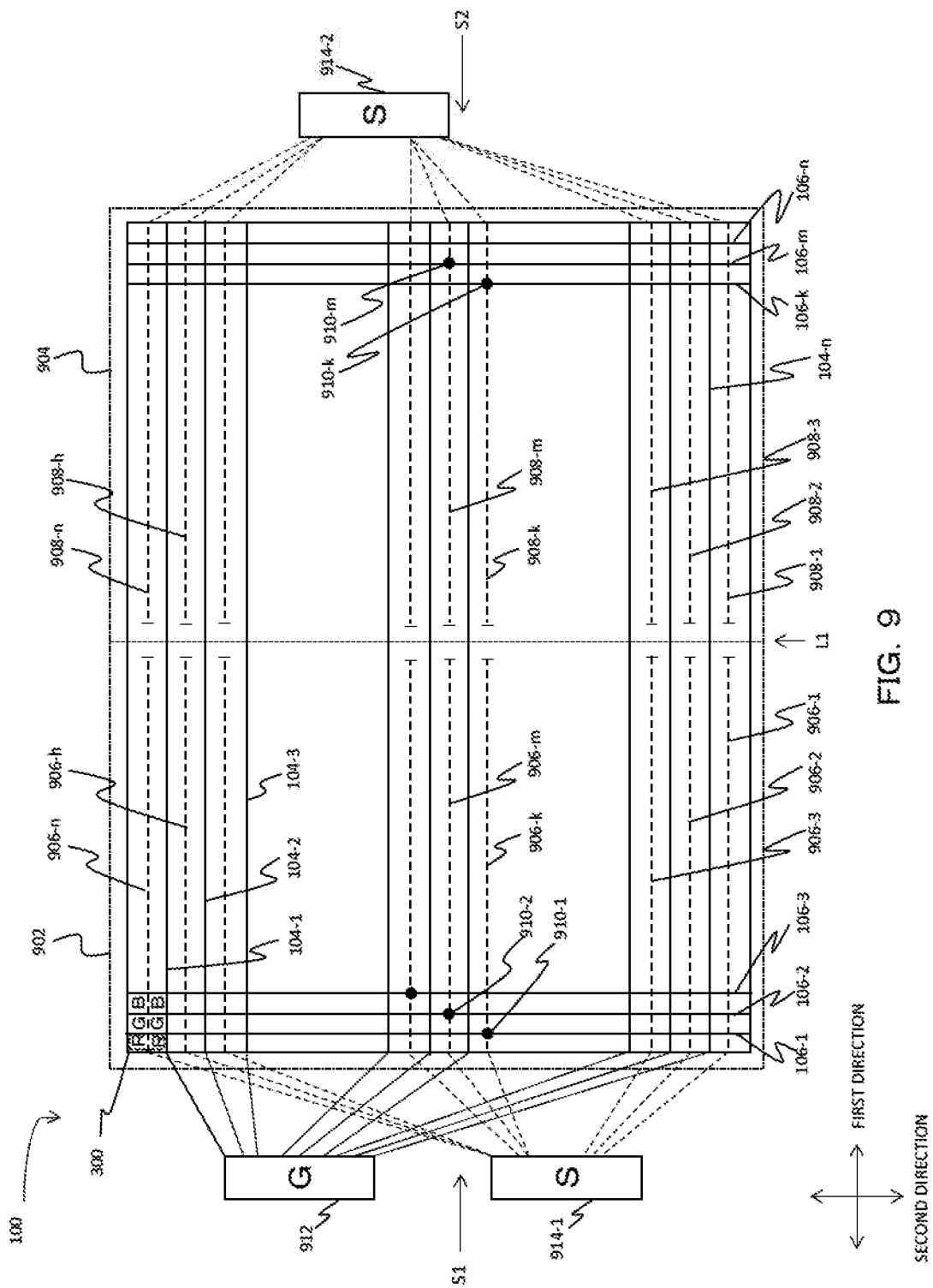
FIG. 9 depicts a schematic representation of the LCD panel, according to another example implementation of the present subject matter.

FIG. 9 depicts a schematic view of the LCD panel 100, according to another implementation of the present subject matter. In an example implementation of the present subject matter, the LCD panel 100 is divided into two segments, a first segment 902 and a second segment 904 by a line L$_1$ along the second direction. The two segments of the LCD panel 100 may include common gate lines 104-1, 104-2, 104-3, ..., 104-$n$ extending along the first direction from the first segment 902 to the second segment 904. The common gate lines 104-1, 104-2, 104-3, ..., 104-$n$ may be substantially parallel to each other. Further, the LCD panel 100 may also include multiple source lines 106-1, 106-2, 106-3, ..., 106-$n$ extending along the second direction. The source lines 106-1, 106-2, 106-3, ..., 106-$n$ may be distributed in the first segment 902 and the second segment 904.

In an example, the source lines 106-1, 106-2, 106-3, ..., 106-$n$ may be substantially parallel to each other, and may be equally distributed in the first segment 902 and the second segment 904. In another example, the distribution of the source lines 106-1, 106-2, 106-3, ..., 106-$n$ amongst the first segment 902 and the second segment 904 is based on size and pixel ratio of the LCD panel 100.

The first segment 902 and the second segment 904 of the LCD panel 100 may include multiple sub-pixel 300 arranged in a first direction and a second direction in form of a matrix, to display an image. Each sub-pixel 300 is arranged in a section between intersection of two adjacent gate lines, such as the gate lines 104-1 and 104-2, and two adjacent source lines, such as source lines 106-1 and 106-2.

Further, the LCD panel 100 may include two sets of source lead-out lines, a first set of source lead-out lines 906-1, 906-2, 906-3, ..., 906-$n$ and a second set of source lead-out lines 908-1, 908-2, 908-3, ..., 908-$n$. In an example implementation of the present subject matter, the first set of source lead-out lines 906-1, 906-2, 906-3, ..., 906-$n$ are formed in the first segment 902 and may extend in the first direction from first side S$_1$ of LCD panel 100 towards a second side S$_2$ of the LCD panel 100, and up to line L$_1$. Further, the second set of source lead-out lines 908-1, 908-2, 908-3, ..., 908-$n$ are formed in the second segment 904 and may extend in the first direction from the second side S₂ of the LCD panel 100 towards the first side S₁ of the LCD panel 100, and up to line L₁.

In an example of the present subject matter, the first set of source lead-out lines 906-1, 906-2, 906-3, ..., 906-*n* and the second set of source lead-out lines 908-1, 908-2, 908-3, ..., 908-*n* are electrically isolated from each other.

In the described implementation of the present subject matter, the gate lines 104-1, 104-2, 104-3, ..., 104-*n* may be driven by a gate driver 912 placed at the first side S₁ of the LCD panel 100. Further, the first set of source lead-out lines 906-1, 906-2, 906-3, ..., 906-*n* are driven by a first source driver 914-1, also placed at the first side S₁ of the LCD panel 100. However, the second set of source lead-out lines 908-1, 908-2, 908-3, ..., 908-*n* are driven by a second source driver 914-2, placed at the second side S₂ of the LCD panel 100.

Furthermore, each source lead-out line from amongst the first set of source lead-out lines 906-1, 906-2, 906-3, ..., 906-*n* extending in the first segment 902 may be electrically connected to one or more source lines 106-1, 106-2, 106-3, ..., 106-*n* within the first segment 902. For example, the source lead-out line 906-*k* may be electrically connected to the source line 106-1 through a contact point 910-1 and the source lead-out line 906-*m* may be electrically connected to the source line 106-2 through a contact point 910-2.

Similarly, each source lead-out line from amongst the second set of source lead-out lines 908-1, 908-2, 908-3, ..., 908-*n* extending in the second segment 904 may be electrically connected to one or more source lines 106-1, 106-2, 106-3, ..., 106-*n* within the second segment 904. For example, the source lead-out line 908-*k* may be electrically connected to the source line 106-*k* through a contact point 910-*k* and the source lead-out line 908-*m* may be electrically connected to the source lines 106-*m* through a contact point 910-*m*.

In an example of the present subject matter, the first set of source lead-out lines 906-1, 906-2, 906-3, ..., 906-*n* and the second set of source lead-out lines 908-1, 908-2, 908-3, ..., 908-*n* may be disposed such that each source lead-out line is disposed between two adjacent gate lines 104-1, 104-2, 104-3, ..., 104-*n*. For example, a source lead-out line extending in the first segment 902, such as the source lead-out line 906-*h* may be disposed between the gate lines 104-1 and 104-2. Similarly, a source lead-out line extending in the second segment 904, such as the source lead-out line 908-*h* may be disposed between the two adjacent gate lines 104-1 and 104-2. It would be appreciated that the two adjacent gate lines 104-1 and 104-2 are common to both the first segment 902 and the second segment 904, and extend from the first side S₁ to the second side S₂ of the LCD panel 100, as described earlier.

As described, in an example of the present subject matter, the source lead-out lines 906-1, 906-2, 906-3, ..., 906-*n* and the source lead-out lines 908-1, 908-2, 908-3, ..., 908-*n* may extend along the third region 336 of the sub-pixel electrode 306. In plan view, the source lead-out lines 906-1, 906-2, 906-3, ..., 906-*n* and the source lead-out lines 908-1, 908-2, 908-3, ..., 908-*n* are formed over the third region 336 of the sub-pixels electrode 306. As described earlier, the third region 336 of the sub-pixel electrode 306 may not contribute to the aspect of the sub-pixel 300 so much, and accordingly, formation of the source lead-out lines 908-1, 908-2, 908-3, ..., 908-*n* in the third region 336 may not reduce the aperture ratio of the sub-pixel 300.

Figure 10:
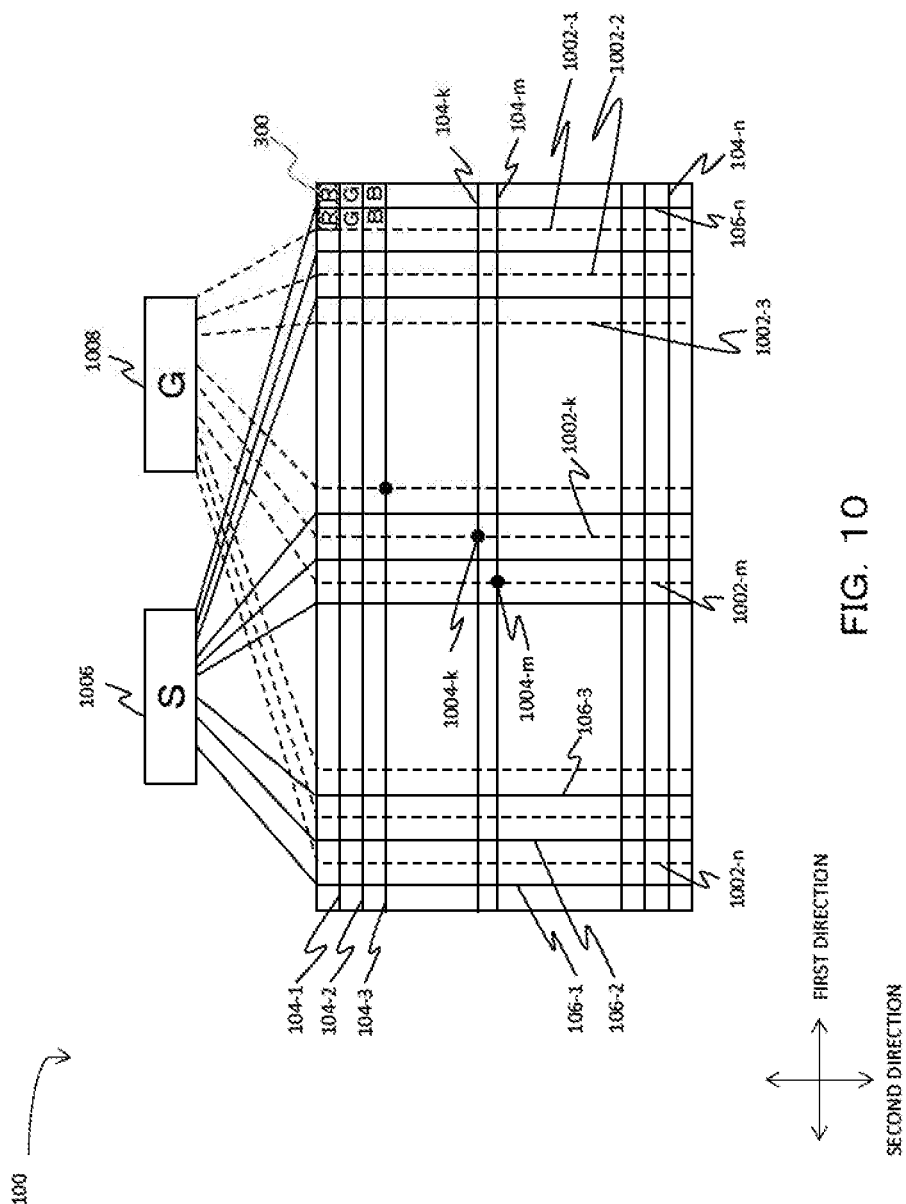
FIG. 10 depicts a schematic representation of the LCD panel, according to another example implementation of the present subject matter.

FIG. 10 depicts a schematic representation of the LCD panel 100, according to an example implementation of the present subject matter. This figure shows a simpler plan configuration of FIG. 2. The LCD panel 100 of the present subject matter includes multiple gate lines 104-1, 104-2, 104-3, ..., 104-*n* extending in the first direction. Further, the LCD panel 100 also includes multiple source lines 106-1, 106-2, 106-3, ..., 106-*n* extending in the second direction.

Further, the LCD panel 100 also includes multiple gate lead-out lines 1002-1, 1002-2, 1002-3, ..., 1002-*n* extending in the second direction, and parallel to the source lines 106-1, 106-2, 106-3, ..., 106-*n*. That is, in the LCD panel 100, the source lines 106-1, 106-2, 106-3, ..., 106-*n* and the gate lead-out lines 1002-1, 1002-2, 1002-3, ..., 1002-*n* may extend in the second direction and the gate lines 104-1, 104-2, 104-3, ..., 104-*n* may extend in the first direction.

In an example of the present subject matter, the gate lead-out lines 1002-1, 1002-2, 1002-3, ..., 1002-*n* are electrically connected to one or more gate lines 104-1, 104-2, 104-3, ..., 104-*n*. For instance, the gate lead-out line 1002-*k* may be electrically connected with the gate line 104-*k* through a contact point 1004-*k*, and the gate lead-out line 1002-*m* may be electrically connected with the gate line 104-*m* through a contact point 1004-*m*. Further, source lines 106-1, 106-2, 106-3, ..., 106-*n* may be driven by a source driver 1006 and the gate lead-out lines 1002-1, 1002-2, 1002-3, ..., 1002-*n* may be driven by a gate driver 1008.

It would be noted that the arrangement of the gate lines 104-1, 104-2, 104-3, ..., 104-*n*, the source lines 106-1, 106-2, 106-3, ..., 106-*n*, and the gate lead-out lines 1002-1, 1002-2, 1002-3, ..., 1002-*n* allows placement of the gate driver 1008 and the source driver 1006 on one side of the LCD panel 100, thereby reducing the bezel size of the LCD device.

It would be appreciated by those skilled in the art that the gate lines extend in the first direction, to provide gate signals to the sub-pixels, and the source lines extend in the second direction, providing source signals to the sub-pixels. In the implementation of the present subject matter gate lead-out lines may drive the gate lines through electrical connections, and equal number of gate lead-out lines may be utilized to drive the gate lines. However, since each pixel includes three sub-pixels, the number of pixels disposed in the first direction would be three times of the number of pixels in the second direction.

Therefore, in the described techniques of providing multiple gate lead-out lines 1002 in the LCD panel 100, along with the gate lines 104-1, 104-2, 104-3, ..., 104-*n* and the source lines 106-1, 106-2, 106-3, ..., 106-*n* may include one third number of pixels in the second direction as compared to the number of number of pixels in the first direction. For example, if the LCD panel 100 includes '640' pixels arranged in the second direction, in the implementation of the present subject matter, the LCD panel 100 may include '1920' pixels in the first direction.

As described earlier, the sub-pixel electrode 306 of the LCD panel 100 may include the described three regions 332,334, and 336 and the gate lead-out lines 1002-1, 1002-2, 1002-3, ..., 1002-*n* may extend along the third region 336 of the sub-pixel electrode 306. In plan view, the gate lead-out lines 1002-1, 1002-2, 1002-3, ..., 1002-*n* are formed over the third region 336 of the sub-pixel electrode 306. As described earlier, the third region 336 of the sub-pixel electrode 306 may not contribute to the aspect of the sub-pixel 300 so much, and accordingly, formation of the gate lead-out lines 1002-1, 1002-2, 1002-3, ..., 1002-*n* in the third region 336 may not reduce the aperture ratio of the sub-pixel 300.

Figure 11:
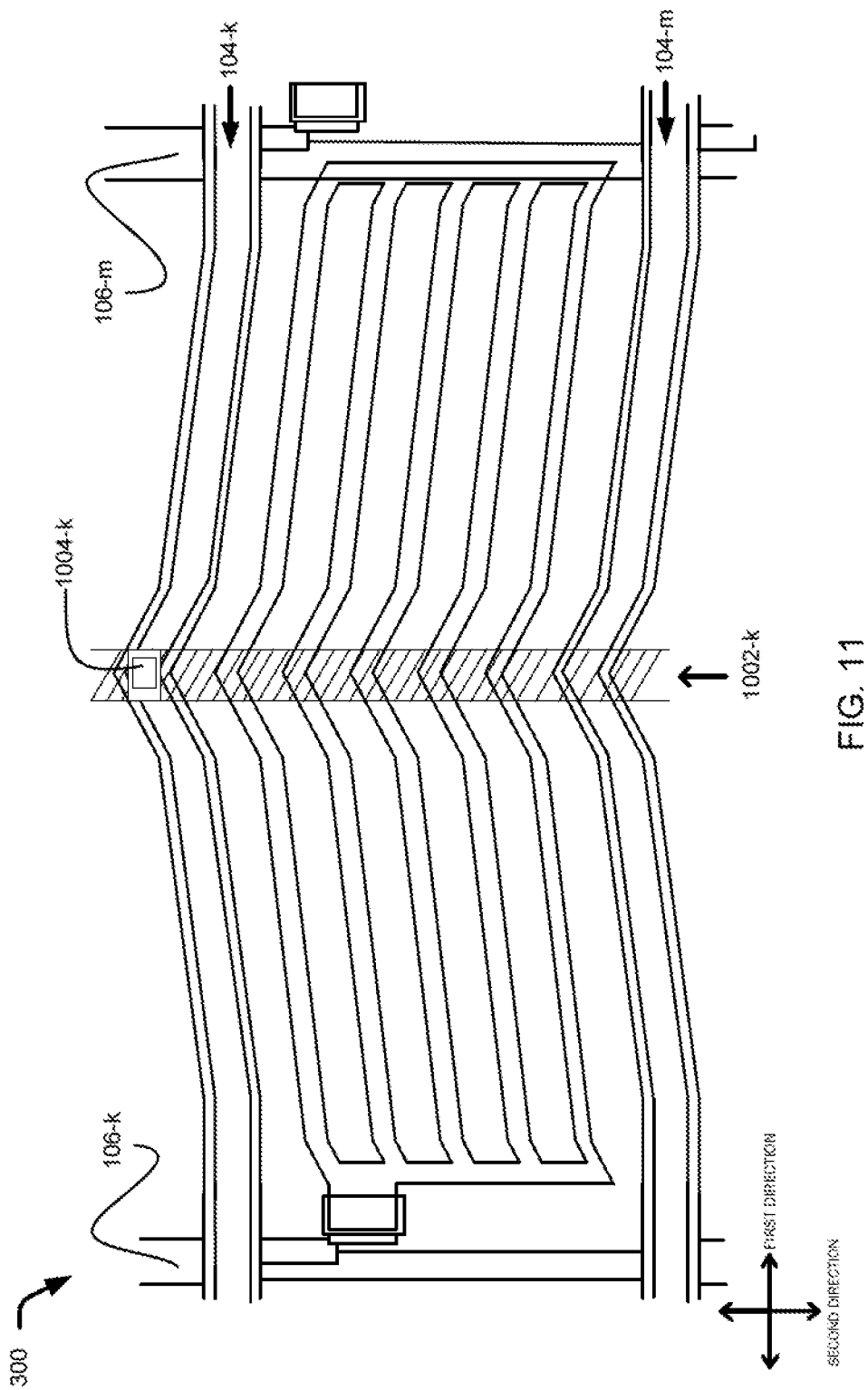
FIG. 11 schematically depicts a plan view of a sub-pixel, according to another example implementation of the present subject matter.

FIG. 11 schematically depicts a plan view of the sub-pixel 300, according to an example implementation of the present subject matter. The sub-pixel may be disposed between the intersection of two gate lines 104-*k* and 104-*m*, and two source lines 106-*k* and 106-*m*.

In an example of the present subject matter, a gate lead-out line 1002-*k* may extend in the second direction, along the third region 336 of the sub-pixel electrode 306. In an example of the present subject matter, the third region 336 of the sub-pixel electrode 306 may not contribute to the aspect of the sub-pixel 300 so much, and accordingly, formation of the gate lead-out line 1002-*k* in the third region 336 may not reduce the aperture ratio of the sub-pixel 300.

Further, the gate lead-out line 1002-*k* may also be electrically connected to a gate line 104-*k* through the contact point 1004-*k*. In implementation, a through hole may be formed in an insulating layer between the gate lead-out line 1002-*k* and the gate line 104-*k* at the contact point 1004-*k*, thereby electrically connecting the gate lead-out line 1002-*k* with the gate line 104-*k*.

In one example, the gate lead-out lines, such as the gate lead-out lines 1002-*k* and the source lines 106-*k* and 106-*m* are formed in the same layer, during fabrication. That is, during the fabrication of the sub-pixel 300, while source lines 106-*k* and 106-*m* are formed in a layer, the gate lead-out line 1002-*k* may also be formed in the same layer, such that the source lines 106-*k* and 106-*m* and the gate lead-out line 1002-*k* are parallel to each other. It would be noted that while the source lines 106-*k* and 106-*m* and the gate lead-out line 1002-*k* are formed in a same layer and are parallel to each other, the source lines 106-*k* and 106-*m* and the gate lead-out line 1002-*k* may be electrically insulated from each other, by a variety of insulating materials, such as Silicon Nitride (SiN) or Silicon Dioxide ($SiO_2$).

In another example, the gate lead-out line 1002-*k* and the source lines 106-*k* and 106-*m* may be formed in different layers, during fabrication. That is, during the fabrication of the sub-pixel 300, while the source lines 106-*k* and 106-*m* are formed in one layer, and the gate lead-out line 1002-*k* may be formed in another layer, where the source lines 106-*k* and 106-*m* and the gate lead-out line 1002-*k* are substantially parallel to each other.

As described earlier, in the described implementation, the LCD panel 100 may include a gate lead-out line 1002-*k* that extends along the third region 336 of the sub-pixel electrode 306. In such an implementation, the LCD panel 100 includes three times the number of pixels in the first direction as compared to the number of pixels in the second direction. That is, the pixel ratio in the first direction and second direction may be 3:1.

However, alternatively, in another implementation of the present subject matter, two or more gate lead-out lines may extend along the third region 336 of the sub-pixel electrode 306. In such an implementation, the LCD panel 100 may include a pixel ratio in the first direction and the second direction of 3:2. The aspect of two or more gate lead-out lines extending along the third region 336 of the sub-pixel electrode 306 has been further described in reference FIG. 12 and FIG. 13.

Figure 12:
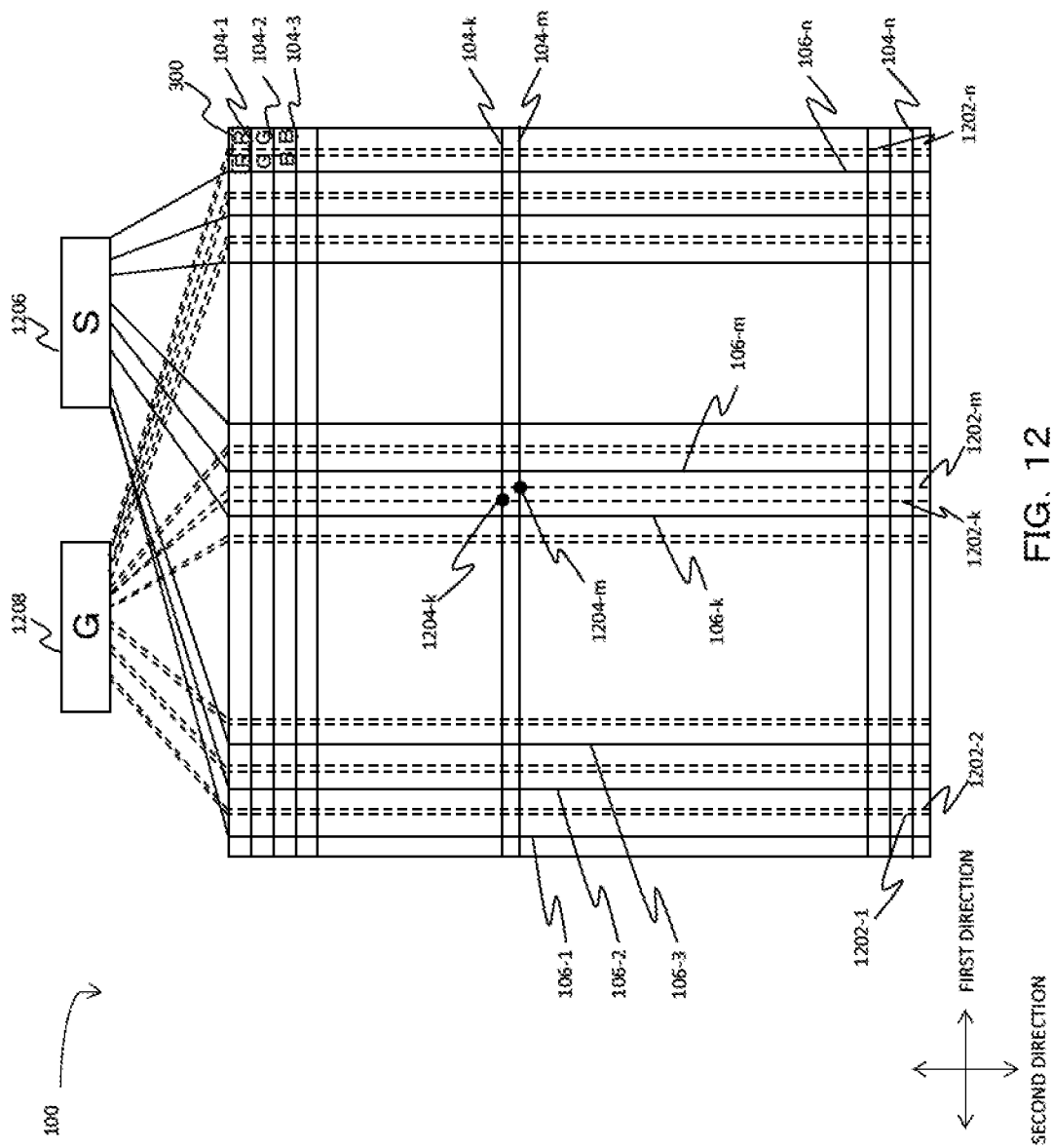
FIG. 12 depicts a schematic representation of the LCD panel, according to another example implementation of the present subject matter.

FIG. 12 depicts a schematic representation of the LCD panel 100, according to an example implementation of the present subject matter. The LCD panel 100 may include multiple gate lines 104-1, 104-2, 104-3, . . . , 104-*n* extending in the first direction, multiple source lines 106-1, 106-2, 106-3, . . . , 106-*n* extending in the second direction. The LCD panel 100 may also include multiple gate lead-out lines 1202-1, 1202-2, 1202-*k*, 1202-*m*, . . . , 1202-*n* extending in the second direction. Further, the gate lead-out lines 1202-1, 1202-2, 1202-*k*, 1202-*m*, . . . , 1202-*n* may be formed in the LCD panel 100 such that at least two gate lead-out lines 1202-1, 1202-2, 1202-*k*, 1202-*m*, . . . , 1202-*n* are formed between two adjacent source lines 106-1, 106-2, 106-3, . . . , 106-*n*.

For example, two gate lead-out lines 1202-*k*, 1202-*m* may be formed between two adjacent source lines 106-*k* and 106-*m*. It would be noted that while formation of two gate lead-out lines 1202-1, 1202-2, 1202-*k*, 1202-*m*, . . . , 1202-*n* has been described between two adjacent source lines 106-1, 106-2, 106-3, . . . , 106-*n*, multiple gate lead-out lines 1202-1, 1202-2, 1202-*k*, 1202-*m*, . . . , 1202-*n* may also be formed between two adjacent source lines 106-1, 106-2, 106-3, . . . , 106-*n*, in different implementations.

In an example of the present subject matter, the gate lead-out lines 1202-1, 1202-2, 1202-*k*, 1202-*m*, . . . , 1202-*n* are electrically connected to one or more gate lines 104-1, 104-2, 104-3, . . . , 104-*n*. For instance, the gate lead-out line 1202-*k* may be electrically connected with the gate lines 104-*k* through a contact point 1204-*k*, and the gate lead-out lines 1202-*m* may be electrically connected with the gate line 104-*k* through a contact point 1204-*m*. In an example of the present subject matter, the multiple source lines 106-1, 106-2, 106-3, . . . , 106-*n* may be driven by a source driver 1206 and the gate lead-out lines 1202-1, 1202-2, 1202-*k*, 1202-*m*, . . . , 1202-*n* may be driven by a gate driver 1208.

As described earlier, the sub-pixel electrode 306 of the LCD panel 100 may include the described three regions 332, 334, and 336. In an example implementation, the gate lead-out lines 1202-1, 1202-2, 1202-*k*, 1202-*m*, . . . , 1202-*n* may extend along the third region 336 of the sub-pixel electrode 306. In plan view, the gate lead-out lines 1202-1, 1202-2, 1202-3, 1202-*n* may be formed over the third region 336 of the sub-pixel electrode 306. As described earlier, the third region 336 of the sub-pixel electrode 306 may not contribute to the aspect of the sub-pixel 300 so much, and accordingly, formation of the gate lead-out lines 1202-1, 1202-2, 1202-*k*, 1202-*m*, . . . , 1202-*n* in the third region 336 may not reduce the aperture ratio of the sub-pixel 300.

Figure 13:
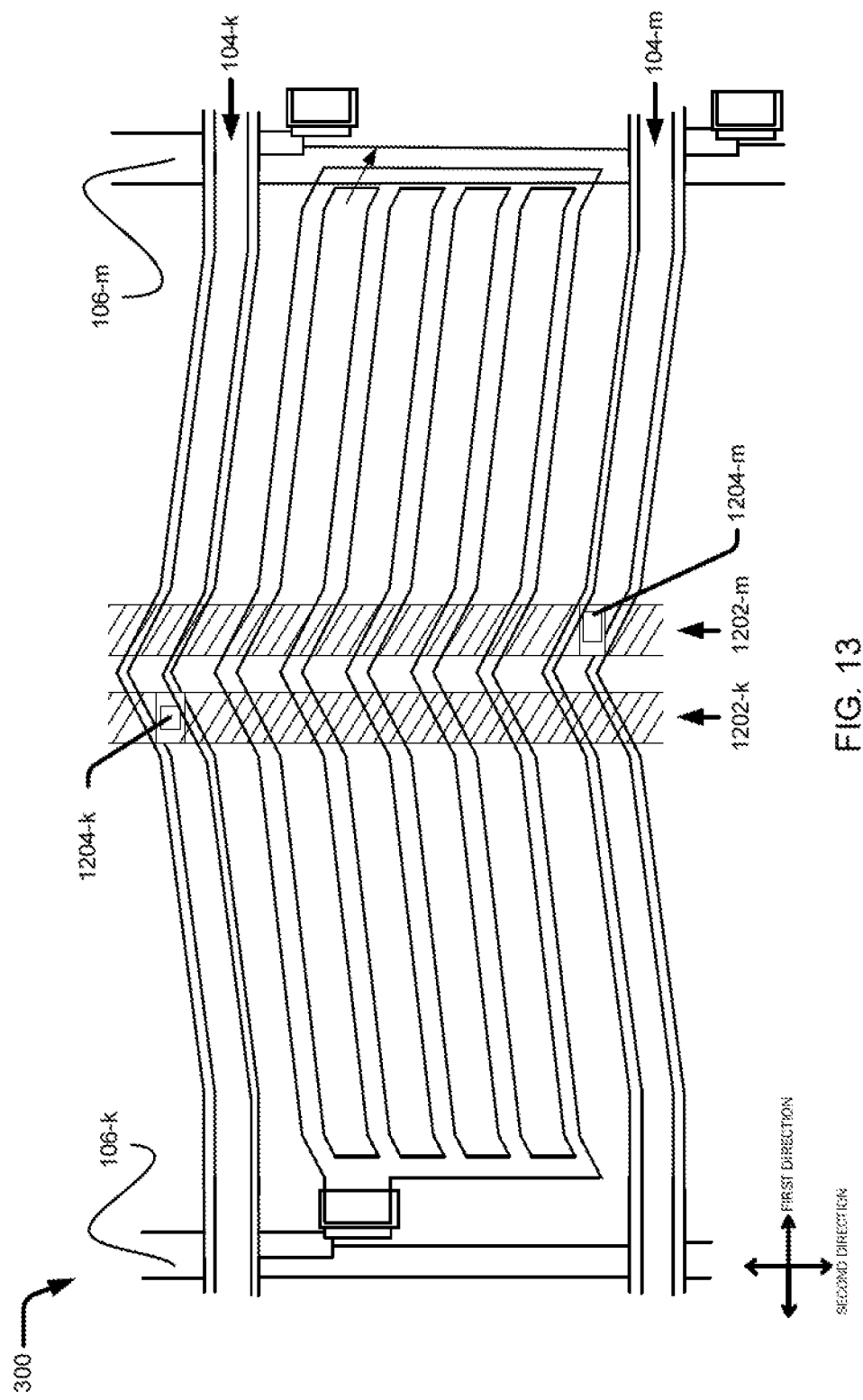
FIG. 13 schematically depicts a plan view of a sub-pixel, according to another example implementation of the present subject matter.

FIG. 13 schematically depicts a plan view of the sub-pixel 300, according to an example implementation of the present subject matter. In an example of the present subject matter, two gate lead-out lines, such as the gate lead-out lines 1202-*k* and 1202-*m* are formed between two adjacent source lines 106-*k* and 106-*m*. Further, the gate lead-out lines 1202-*k* and 1202-*m* may extend in the second direction, along the third region of the sub-pixel 300. Furthermore, the gate lead-out lines 1202-*k* may be electrically connected with the gate line 104-*k* through the contact point 1204-*k*, and the gate lead-out line 1202-*m* may be electrically connected with the gate line 104-*m* through the contact point 1204-*m*. In an implementation, a through hole may be formed in an insulating layer between the gate lead-out lines 1202-*k* and the gate lines 104-*k* at the contact point 1204-*k*, thereby electrically connecting the gate lead-out line 1202-*k* with the gate line 104-*k*. Similarly, a through hole may be formed in an insulating layer between the gate lead-out line 1202-*m* and the gate line 104-*m* at the contact point 1204-*m*, thereby electrically connecting the gate lead-out line 1202-*m* with the gate line 104-*m*.

Since in the described implementation of the present subject matter, two gate lead-out lines may extend along the third region 336 of the sub-pixel electrode 306, the ratio of pixels in the first direction and the second direction may change from 3:1 to 3:2. For example, if the LCD panel 100 includes '1280' pixels arranged in the second direction, the implementation of the described implementation would entail that the LCD panel 100 may include '1920' pixels in the first direction.

In one example, the gate lead-out lines 1202-k and 1202-m and the source lines 106-k and 106-m may be formed in a same layer, during fabrication. That is, during the fabrication of the sub-pixel 300, while the source lines 106-k and 106-m are formed in one layer, the gate lead-out lines 1202-k and 1202-m may also be formed in the same layer, and parallel to each other. It would be noted that while the source lines 106-k and 106-m and the gate lead-out lines 1202-k and 1202-m are formed in a same layer and parallel to each other, the source lines 106-k and 106-m and the gate lead-out lines 1202-k and 1202-m may be electrically insulated from each other, by a variety of insulating materials, such as Silicon Nitride (SiN) or Silicon Dioxide ($SiO_2$).

In another example, the source lines 106-k and 106-m and the gate lead-out lines 1202-k and 1202-m may be formed in different layers, during fabrication. That is, during the fabrication of the sub-pixel 300, while the source lines 106-k and 106-m is formed in one layer, the gate lead-out lines 1202-k and 1202-m may be formed in another layer, where the source lines 106-k and 106-m and the gate lead-out lines 1202-k and 1202-m are substantially parallel to each other.

Figure 14:
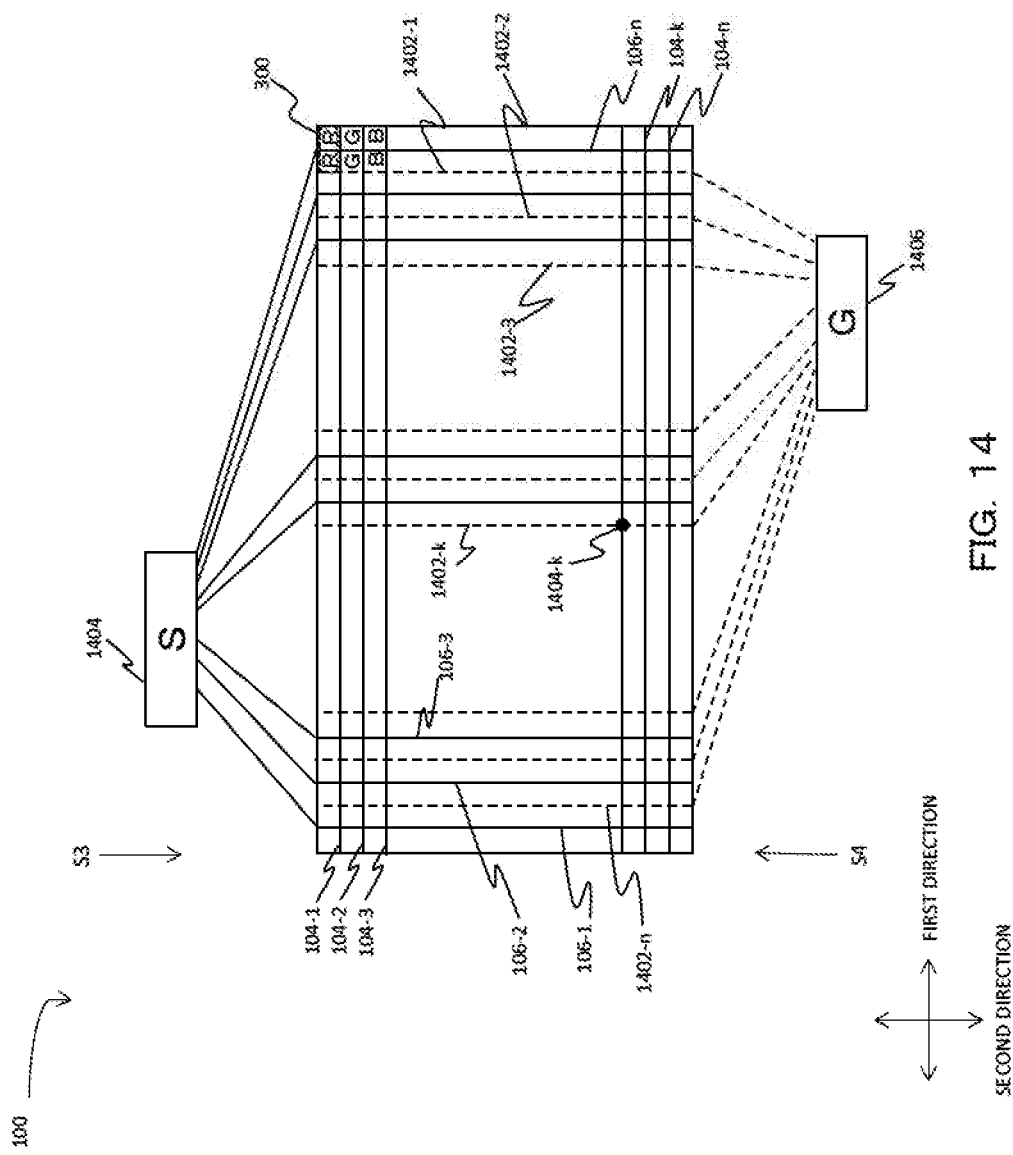
FIG. 14 depicts a schematic representation of the LCD panel, according to another example implementation of the present subject matter.

FIG. 14 depicts a schematic view of the LCD panel 100, according to an example implementation of the present subject matter. In an implementation of the present subject matter, the LCD panel 100 may include multiple gate lead-out lines 1402-1, 1402-2, 1402-3, 1402-n extending in the second direction along with the gate lines 104-1, 104-2, 104-3, . . . , 104-n extending in the first direction and the source lines 106-1, 106-2, 106-3, . . . , 106-n extending in the second direction. In an example of the present subject matter, the gate lead-out lines 1402-1, 1402-2, 1402-3, 1402-n may be substantially parallel to each other, and also parallel to the source lines 106-1, 106-2, 106-3, . . . , 106-n.

In an example of the present subject matter, the source lines 106-1, 106-2, 106-3, . . . , 106-n may be driven by a source driver 1404 placed at third side ($S_3$) of the LCD panel 100, and the gate lead-out lines 1402-1, 1402-2, 1402-3, 1402-n may be driven by a gate driver 1406 placed at a fourth side ($S_4$) of the LCD panel 100. As depicted in FIG. 14, the source driver 1404 and the gate driver 1406 may be placed opposite to each other to drive the source lines 106-1, 106-2, 106-3, . . . , 106-n and the gate lead-out lines 1402-1, 1402-2, 1402-3, 1402-n, respectively.

Further, in an example of the present subject matter, each of the gate lead-out lines 1402-1, 1402-2, 1402-3, 1402-n may be electrically connected to one or more of the gate lines 104-1, 104-2, 104-3, . . . , 104-n through contact points. For example, the gate lead-out line 1402-k may be electrically connected to the gate line 104-k through a contact point 1404-k.

As described earlier, in an example of the present subject matter, the gate lead-out lines 1402-1, 1402-2, 1402-3, 1402-n may extend along the third region 336 of the sub-pixel electrode 306. In plan view, the gate lead-out lines 1402-1, 1402-2, 1402-3, 1402-n are formed over the third region 336 of the sub-pixel electrode 306. In an example of the present subject matter, the third region 336 of the sub-pixel electrode 306 may not contribute to the aspect of the sub-pixel 300 so much, and accordingly, formation of the gate lead-out lines 1402-1, 1402-2, 1402-3, 1402-n in the third region 336 may not reduce the aperture ratio of the sub-pixel 300.

Figure 15:
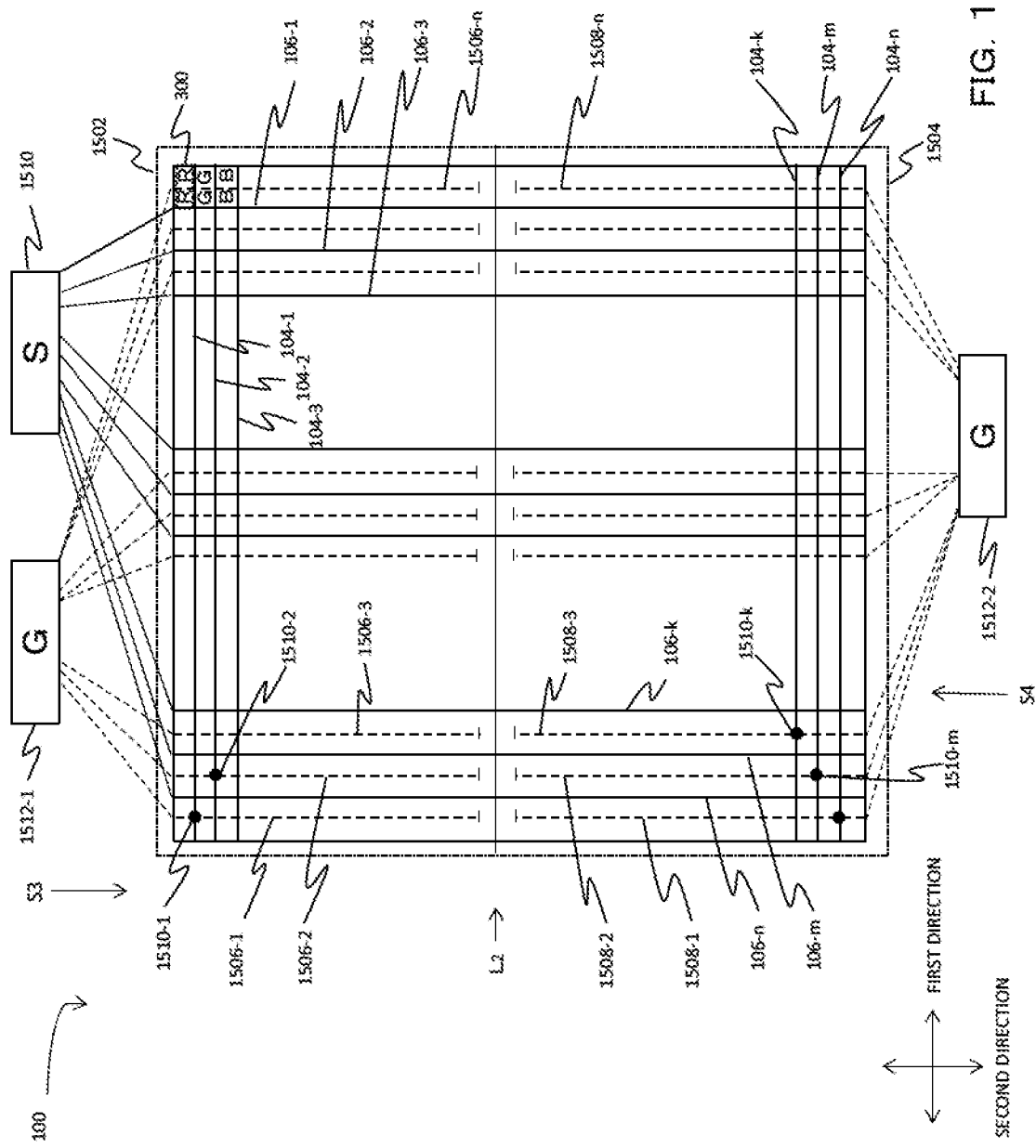
FIG. 15 depicts a schematic representation of the LCD panel, according to another example implementation of the present subject matter.

FIG. 15 depicts a schematic view of the LCD panel 100, according to another implementation of the present subject matter. In an example implementation of the present subject matter, the LCD panel 100 is divided into two segments, a first segment 1502 and a second segment 1504 by a line ($L_2$) along the first direction. The two segments of the LCD panel 100 may include common gate lines 104-1, 104-2, 104-3, . . . , 104-n extending along the first direction and distributed in the first segment 1502 as well as in the second segment 1504, and common source lines 106-1, 106-2, 106-3, . . . , 106-n extending along the second direction from the first segment 1502 to the second segment 1504. The common gate lines 104-1, 104-2, 104-3, . . . , 104-n may be substantially parallel to each other and the common source lines 106-1, 106-2, 106-3, . . . , 106-n may also be substantially parallel to each other.

In an example implementation, the gate lines 104-1, 104-2, 104-3, . . . , 104-n may be equally distributed in the first segment 1502 and the second segment 1504. In another example, the distribution of the gate lines 104-1, 104-2, 104-3, . . . , 104-n amongst the first segment 1502 and the second segment 1504 is based on size and pixel ratio of the LCD panel 100.

The first segment 1502 and the second segment 1504 of the LCD panel 100 may include multiple sub-pixel 300 arranged in a first direction and a second direction in form of a matrix, to display an image. Each sub-pixel 300 is arranged in a section between intersection of two adjacent gate lines, such as the gate lines 104-1 and 104-2, and two adjacent source lines, such as source lines 106-1 and 106-2.

Further, the LCD panel 100 may include two sets of gate lead-out lines, a first set of gate lead-out lines 1506-1, 1506-2, 1506-3, . . . , 1506-n and a second set of gate lead-out lines 1508-1, 1508-2, 1508-3, . . . , 1508-n. In an example implementation of the present subject matter, the first set of gate lead-out lines 1506-1, 1506-2, 1506-3, . . . , 1506-n are formed in the first segment 1502 and may extend in the second direction from third side $S_3$ of LCD panel 100 towards a fourth side $S_4$ of the LCD panel 100, and up to line $L_2$. Further, the second set of gate lead-out lines 1508-1, 1508-2, 1508-3, . . . , 1508-n are formed in the second segment 1504 and may extend in the second direction from the fourth side $S_4$ of the LCD panel 100 towards the third side $S_3$ of the LCD panel 100, and up to line $L_2$.

In an example implementation of the present subject matter, the first set of gate lead-out lines 1506-1, 1506-2, 1506-3, . . . , 1506-n and the second set of gate lead-out lines 1508-1, 1508-2, 1508-3, . . . , 1508-n are electrically isolated from each other.

In the described implementation of the present subject matter, the source lines 106-1, 106-2, 106-3, . . . , 106-n of the LCD panel 100 may be driven by a source driver 1510 placed at the third side ($S_3$) of the LCD panel 100. Further, the first set of gate lead-out lines 1506-1, 1506-2, 1506-3, . . . , 1506-n are driven by a first gate driver 1512-1, also placed at the third side ($S_3$) of the LCD panel 100. However, the second set of gate lead-out lines 1508-1, 1508-2, 1508-3, . . . , 1508-n is driven by a second gate driver 1512-2, placed at the fourth side ($S_4$) of the LCD panel 100.

Furthermore, each gate lead-out line from amongst the first set of gate lead-out lines 1506-1, 1506-2, 1506-3, . . . , 1506-n extending in the first segment 1502 may be electrically connected to one or more gate lines 104-1, 104-2, 104-3, . . . , 104-n within the first segment 1502. For example, the gate lead-out line 1506-1 may be electrically connected to the gate line 104-1 through a contact point 1510-1 and the gate lead-out line 1506-2 may be electrically connected to the gate line 104-2 through a contact point 1510-2.

Similarly, each gate lead-out line from amongst the second set of gate lead-out lines 1508-1, 1508-2, 1508-3, . . . , 1508-n extending in the second segment 1504 may be electrically connected to one or more gate lines 104-1, 104-2, 104-3, . . . , 104-n within the second segment 1504. For example, the gate lead-out line 1508-3 may be electrically connected to the gate line 104-k through a contact point 1510-k and the gate lead-out line 1508-2 may be electrically connected to the gate line 104-m through a contact point 1510-m.

In an example of the present subject matter, the first set of gate lead-out lines 1506-1, 1506-2, 1506-3, . . . , 1506-n and the second set of gate lead-out lines 1508-1, 1508-2, 1508-3, . . . , 1508-n may be disposed such that each gate lead-out line is disposed between two adjacent source lines 106-1, 106-2, 106-3, . . . , 106-n. For example, a gate lead-out line extending in the first segment 1502, such as the gate lead-out line 1506-1 may be disposed between the source lines 106-m and 106-n. Similarly, a gate lead-out line extending in the second segment 1504, such as the gate lead-out line 1508-1 may be disposed between the source lines 106-m and 106-m. It would be appreciated that the source lines 106-m and 106-n are common to both the first segment 1502 and the second segment 1504, and extend from the third side $S_3$ to the fourth side $S_4$ of the LCD panel 100, as described earlier.

As described, in an example of the present subject matter, the first set of gate lead-out lines 1506-1, 1506-2, 1506-3, . . . , 1506-n may extend along the third region 336 of the sub-pixel electrode 306. In plan view, the first set of gate lead-out lines 1506-1, 1506-2, 1506-3, . . . , 1506-n and the second set of gate lead-out lines 1508-1, 1508-2, 1508-3, . . . , 1508-n may be formed over the third region 336 of the sub-pixel electrode 306.

Although implementations for LCD devices have been described in a language specific to structural features, it is to be understood that the appended claims are not necessarily limited to the specific features described. Rather, the specific features are disclosed as example implementations for the LCD devices.

I claim:

1. A liquid crystal display (LCD) device comprising: an LCD panel, the LCD panel comprises:
    a plurality of sub-pixels arranged in a first direction and a second direction in a matrix arrangement;
    a plurality of gate lines extending in the first direction;
    a plurality of source lines extending in the second direction; and
    a plurality of source lead-out lines extending in the first direction, wherein each of the plurality of source lead-out lines is electrically connected to at least one of the plurality of source lines,
    wherein the sub-pixel from the plurality of sub-pixels comprises a sub-pixel electrode, the sub-pixel electrode comprising:
    a first region including a first set of slits extending in one direction,
    a second region including a second set of slits extending in another direction,
    a third region including a boundary of the first set of slits and the second set of slits,
    a source lead-out line from the plurality of source lead-out lines extends along and overlaps with the third region of the sub-pixel electrode, and
    wherein the LCD panel is divided into two segments: a first segment and a second segment by a line along the second direction,
    wherein the plurality of source lead-out lines includes a first set of source lead-out line formed in the first segment and a second set of source lead-out line formed in the second segment, and the first set of source lead-out lines and the second set of source lead-out line are electrically isolated from each other.

2. The LCD device as claimed in claim 1, wherein at least two source lead-out lines from the plurality of source lead-out lines overlap a part of the third region of the sub-pixel, in plan view.

3. The LCD device as claimed in claim 1 further comprising:
    a gate driver placed at a first side of the LCD panel, the gate driver being electrically connected to the plurality of gate lines; and
    a source driver placed at the first side of the LCD panel, the source driver being electrically connected to the plurality of source lines via the plurality of source lead-out lines.

4. The LCD device as claimed in claim 1 further comprising:
    a gate driver placed at a first side of the LCD panel, the gate driver being electrically connected to the plurality of gate lines; and
    a source driver placed at a second side of the LCD panel opposite to the first side, the source driver being electrically connected to the plurality of source lines via the plurality of source lead-out lines.

5. The LCD device as claimed in claim 1, wherein the LCD panel further comprises:
    a first source driver placed at a first side of the LCD panel, the first source driver being electrically connected to the first set of source lead-out lines; and
    a second source driver placed at a second side of the LCD panel opposite to the first side, the second source driver being electrically connected to the second set of source lead-out lines.

6. The LCD device as claimed in claim 5 further comprises a first gate driver placed at the first side of the LCD panel, wherein the first gate driver is electrically connected to the plurality of gate lines, and each of the plurality of gate line extends continuously in both the first segment and the second segment.

7. The LCD device as claimed in claim 6, wherein the plurality of gate line includes a first gate line and a second gate line formed adjacent to each other, the first set of source lead-out lines include a first source lead-out line, and the second set of source lead-out lines include a second source lead-out line, wherein the first source lead-out line and the second source lead-out line are formed between the first gate line and the second gate line.

8. The LCD device as claimed in claim 1, wherein the plurality of gate lines and the plurality of source lead-out lines are formed in a same layer.

9. An LCD device comprising an LCD panel, wherein the LCD panel comprises:
    a plurality of sub-pixels arranged in a first direction and a second direction in a matrix arrangement;
    a plurality of gate lines extending in the first direction;
    a plurality of source lines extending in the second direction; and
    a plurality of lead-out lines extending in the first direction, the plurality of lead-out lines being electrically connected to one of the plurality of gate lines and the plurality of source lines, wherein each of the plurality of lead-out lines is electrically connected to at least one of the plurality of gate lines, the LCD panel is divided into two segments: a first segment and a second segment by a line along the first direction, and the plurality of lead-out lines includes a first set of lead-out line formed in the first segment; a second set of lead-out line formed in the second segment, and the first set of lead-out lines and the second set of lead-out lines are electrically isolated from each other.

10. The LCD device as claimed in claim 9, wherein at least two lead-out lines from the plurality of lead-out lines overlap a part of the third region of the sub-pixel.

11. The LCD device as claimed in claim 9, wherein the LCD panel further comprises:

a first gate driver placed at a first side of the LCD panel, the first gate driver being electrically connected to the first set of lead-out line; and a second gate driver placed at a second side of the LCD panel opposite to the first side, the second gate driver being electrically connected to the second set of lead-out line.

12. The LCD device as claimed in claim 11 further comprises a first source driver placed at the first side of the LCD panel, wherein the first source driver is electrically connected to the plurality of source lines, and each of the plurality of source line extends continuously in both the first segment and the second segment.

13. The LCD device as claimed in claim 12, wherein the plurality of source line includes a first source line and a second source line formed adjacent to each other, the first set of lead-out lines include a first lead-out line and the second set of lead-out lines include a second lead-out line, wherein the first lead-out line and the second lead-out line are formed between the first source line and the second source line.

* * * * *